United States Patent
Kurose et al.

(10) Patent No.: US 10,557,533 B2
(45) Date of Patent: Feb. 11, 2020

(54) LINEAR MOTION MECHANISM FORMED INTEGRALLY

(71) Applicant: NEC Corporation, Tokyo (JP)

(72) Inventors: Minoru Kurose, Tokyo (JP); Kazuo Hamada, Tokyo (JP); Yoshihiko Katsuyama, Tokyo (JP); Takashi Kamizono, Tokyo (JP); Takuro Kobayashi, Tokyo (JP); Naoto Tanimichi, Tokyo (JP); Tsui Happy, Castaic, CA (US)

(73) Assignee: NEC Corporation, Tokyo (JP)

( * ) Notice: Subject to any disclaimer, the term of this patent is extended or adjusted under 35 U.S.C. 154(b) by 426 days.

(21) Appl. No.: 14/813,342

(22) Filed: Jul. 30, 2015

(65) Prior Publication Data

US 2017/0030444 A1 Feb. 2, 2017

(51) Int. Cl.
| B81B 3/00 | (2006.01) |
| F16H 25/18 | (2006.01) |
| B23Q 1/34 | (2006.01) |
| B23Q 1/36 | (2006.01) |
| B25J 9/00 | (2006.01) |

(52) U.S. Cl.
CPC ............ *F16H 25/183* (2013.01); *B23Q 1/34* (2013.01); *B23Q 1/36* (2013.01); *B25J 9/0051* (2013.01); *B81B 3/00* (2013.01)

(58) Field of Classification Search
CPC ........ B81B 3/00; B25J 9/0051; F16H 25/183; B23Q 1/34; B23Q 1/36; F16F 1/025; F16F 1/027; F16F 1/34; F16F 2230/34
USPC .......................... 74/110; 267/42, 43, 158, 165
See application file for complete search history.

(56) References Cited

U.S. PATENT DOCUMENTS 1,558,387 A * 10/1925 Morines ................. B60G 11/02
267/42
2009/0278420 A1 11/2009 Sun et al.
2013/0194028 A1 8/2013 Brandl et al.

FOREIGN PATENT DOCUMENTS

| CN | 102355159 B | 5/2014 |
| DE | 2359971 A1 | 6/1975 |
| DE | 29618149 U1 | 12/1996 |
| DE | 69406876 T2 | 6/1998 |

(Continued)

OTHER PUBLICATIONS

Hammond, Measuring the Spring Constant of a Cantilever Leaf Spring, LIGO, Technical Note LIGO-T030259-00-D, Jul. 26, 2003, pp. 1-7 (Year: 2003).*

(Continued)

*Primary Examiner* — Victor L MacArthur
*Assistant Examiner* — Randell J Krug
(74) *Attorney, Agent, or Firm* — Wilmer Cutler Pickering Hale and Dorr LLP

(57) ABSTRACT

A linear motion mechanism with precise linear motion has structural robustness and allows easy reduction in weight and size, simple production and easy operation. The linear motion mechanism includes: an elastic arrangement which is arranged to transform an input direction and an input displacement to an output direction and an output displacement, wherein the output direction is orthogonal to the input direction; an operating member which is arranged to deform the elastic arrangement in the input direction by the input displacement; and a movable member fixed to the elastic arrangement to move in the output direction by the output displacement.

9 Claims, 22 Drawing Sheets

FIRST EXAMPLARY EMBODIMENT

(56) References Cited

FOREIGN PATENT DOCUMENTS

| JP | 47-21767 B1 | 6/1972 |
| JP | H10-110799 A | 4/1998 |
| JP | 2003-075572 | 3/2003 |
| JP | 2008-066801 A | 3/2008 |
| JP | 2009-000800 A | 1/2009 |
| JP | 2009-196060 A | 9/2009 |

OTHER PUBLICATIONS

International Search Report and Written Opinion issued in corresponding International Application PCT/JP2015/004605, dated Dec. 15, 2015, 10 pages.
Extended European Search Report dated Mar. 6, 2019 received in related European Patent Application No. 15899546.4 (8 pages).

\* cited by examiner

FIG. 5 SECOND EXAMPLARY EMBODIMENT

FIRST APPLICATION

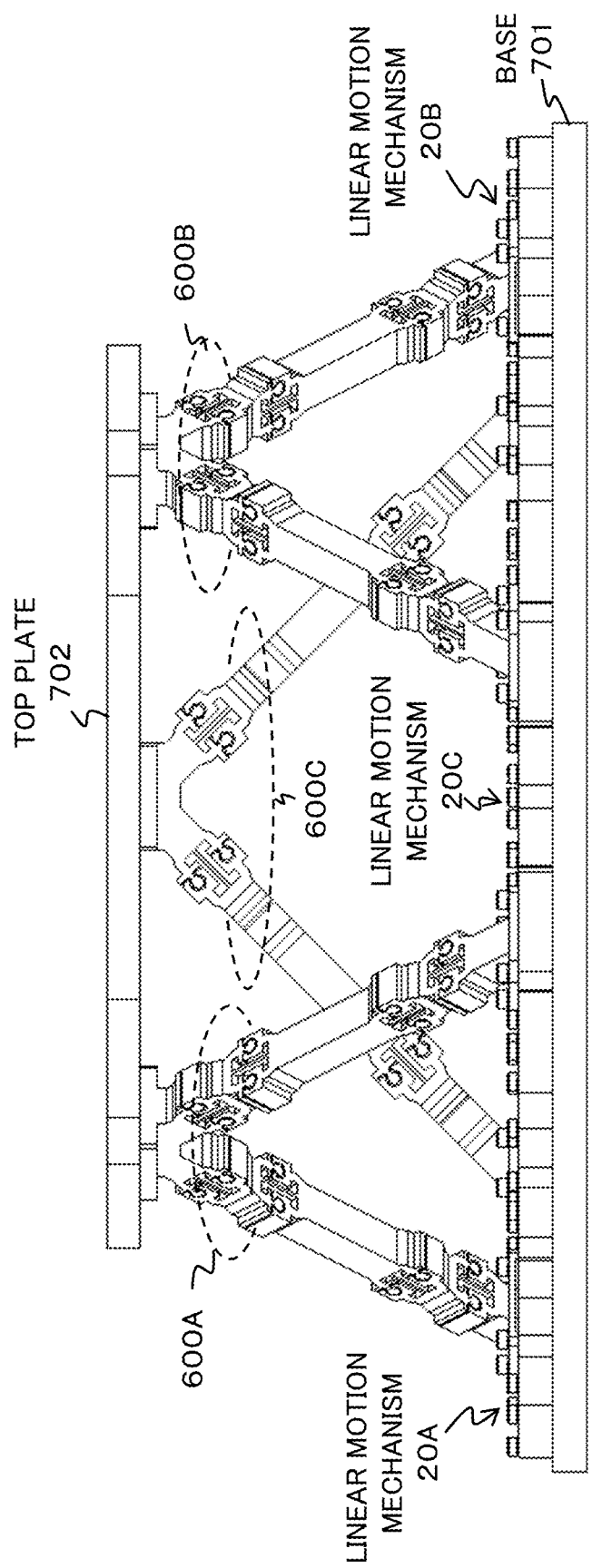

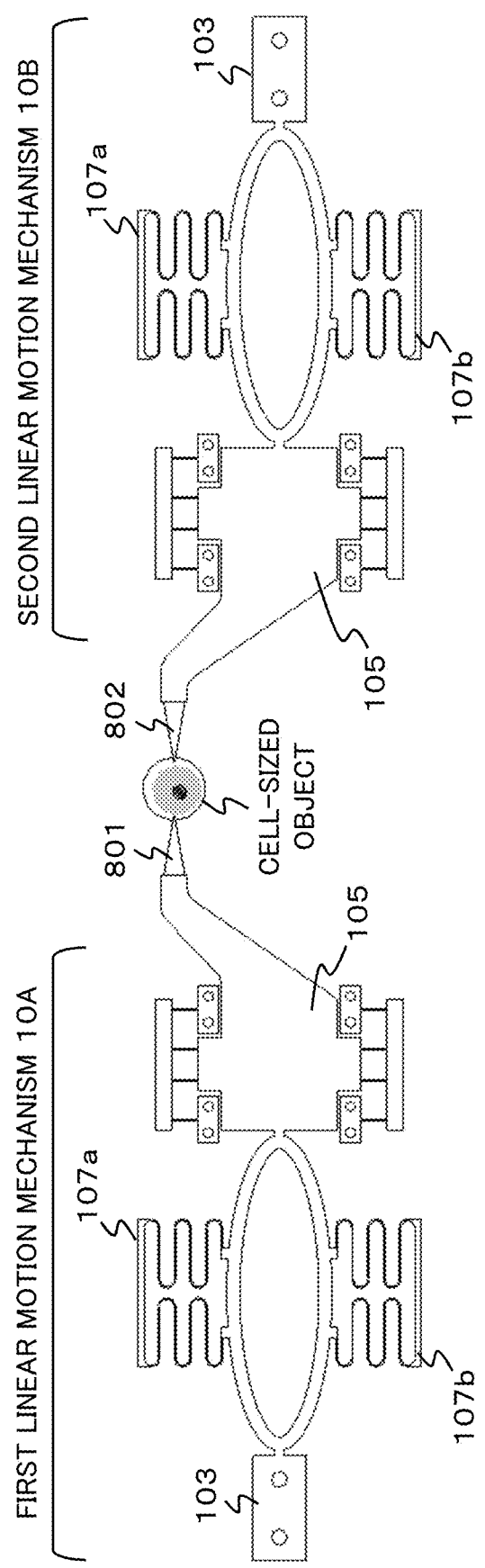

LINEAR MOTION MECHANISM FORMED INTEGRALLY

BACKGROUND OF THE INVENTION

1. Field of the Invention

The present invention relates to a linear motion mechanism which uses the elasticity of springs.

2. Description of the Related Art

With the increasing market demand for precision technology, a linear motion actuator providing high precision has become important for machinery requiring precise displacement such as multiple-degree-of-freedom displacement mechanism, micro-manipulator or the like. In most cases, such a fine linear motion actuator employs reduction gearing mechanism, which requires not only a plurality of parts such as different gears but also backlash adjustment of gears and other alignments during its assembly.

In order to eliminate the need of backlash adjustment and other alignments, there has been proposed a simplified linear motion mechanism using a combination of elastic plates to allow fine linear displacement (see Japanese Patent Unexamined Publication No. JP2003-075572). More specifically, two elastic plates are fixed to a fixed block at one ends and to a movable block at the other ends. The two elastic plates placed in parallel are connected by a curve elastic plate in the approximate shape of a letter H. The movable block is supported by an elastic plate orthogonal to a plane formed by the H-shaped elastic plates. The curve elastic plate is connected to the slider of a micrometer at the center thereof. Accordingly, extension or contraction of the slider causes the curve elastic plate to push or pull the parallel elastic plates in widening or narrowing directions, which linearly moves the movable block in the retracting or extending direction.

SUMMARY OF THE INVENTION

However, the above-mentioned linear motion actuator using reduction gearing mechanism requires a plurality of parts, complicated assembly process and complicated adjustment operations. The above-mentioned linear motion mechanism using the elasticity of combined elastic plates has the spatial arrangement of a plurality of elastic plates, resulting in weakness in structural strength, which makes it difficult to achieve precise displacements. Accordingly, the existing techniques cannot achieve a light-weight, miniaturized and simply-manufactured linear motion mechanism providing high precision.

An object of the present invention is to provide a novel linear motion mechanism with precise linear motion, which has structural robustness and allows easy reduction in weight and size, simple production and easy operation.

According to the present invention, a linear motion mechanism includes: an elastic arrangement which is arranged to transform an input direction and an input displacement to an output direction and an output displacement, wherein the output direction is orthogonal to the input direction; a operating member which is arranged to deform the elastic arrangement in the input direction by the input displacement; and a movable member fixed to the elastic arrangement to move in the output direction by the output displacement.

According to the present invention, a linear motion mechanism includes: an elastic elliptical ring wherein one end of its major axis is fixed and the other end is movable; a operating member which is arranged to deform the elastic elliptical ring in a direction of the minor axis of the elastic elliptical ring; a movable member fixed to the other end of the elastic elliptical ring; and an elastic support member which is arranged to elastically support the movable member.

According to the present invention, a linear motion mechanism includes: a first linear motion section; and a second linear motion section which is fixed to the first linear motion section at a common fixed point, wherein each of the first and second linear motion sections comprises: an elastic arrangement which is arranged to transform an input direction and an input displacement to an output direction and an output displacement, wherein the output direction is orthogonal to the input direction; a operating member which is arranged to deform the elastic arrangement in the input direction by the input displacement; and a movable member fixed to the elastic arrangement to move in the output direction by the output displacement, wherein the movable member of each of the first and second linear motion sections independently moves in the output direction of a corresponding linear motion section.

BRIEF DESCRIPTION OF THE DRAWINGS

FIG. 17 is a side view illustrating a hexapod mechanism as a second application of the linear motion mechanism according to the second exemplary embodiment of the present invention.

FIG. 22 is a diagram illustrating the mechanical and electronic structure of a micro-manipulator as a third application of the linear motion mechanism according to the first exemplary embodiment of the present invention.

DETAILED DESCRIPTION OF THE EMBODIMENTS

A linear motion mechanism is arranged to transform an input direction and an input displacement to an output direction orthogonal to the input direction and an output displacement smaller than the input displacement. The linear motion mechanism has a two-dimensional structure in which the input and output directions are provided on a plane. A ratio between the output displacement and the input displacement may be determined by spring constants of elastic members composing the linear motion mechanism.

More specifically, the linear motion mechanism may include an elliptical ring section, an operating section, a movable section and a support section which are made of elastic material and integrally formed. The elliptical ring section has a function of transforming the operating direction to the orthogonal direction with one end of the major axis thereof being fixed and the other end of the major axis being movable. The operating section is placed so as to press the elliptical ring section in the direction of the minor axis thereof. Accordingly, by the operating section pressing or stretching the elliptical ring section, the elliptical ring section is elastically deformed to linearly move the movable section along the major axis of the elliptical ring section.

It is preferable to provide an elastic supporting section on both sides of the movable section to ensure the linear motion of the movable section along the major axis of the elliptical ring section. The elastic supporting section may be composed of a plurality of leaf springs connecting the movable section on both sides to a fixed section. The elliptical ring section, the operating section and the elastic supporting section may have different spring constants so as to provide various speed reduction ratios. In order to obtain a desired speed reduction ratio, the operating section and the elastic supporting section may be provided with a lower spring constant (soft spring) and a higher spring constant (hard spring), respectively. Hereinafter, various exemplary embodiments of the present invention will be describe with references to figures.

1. First Exemplary Embodiment 1.1) Structure

Figure 1:
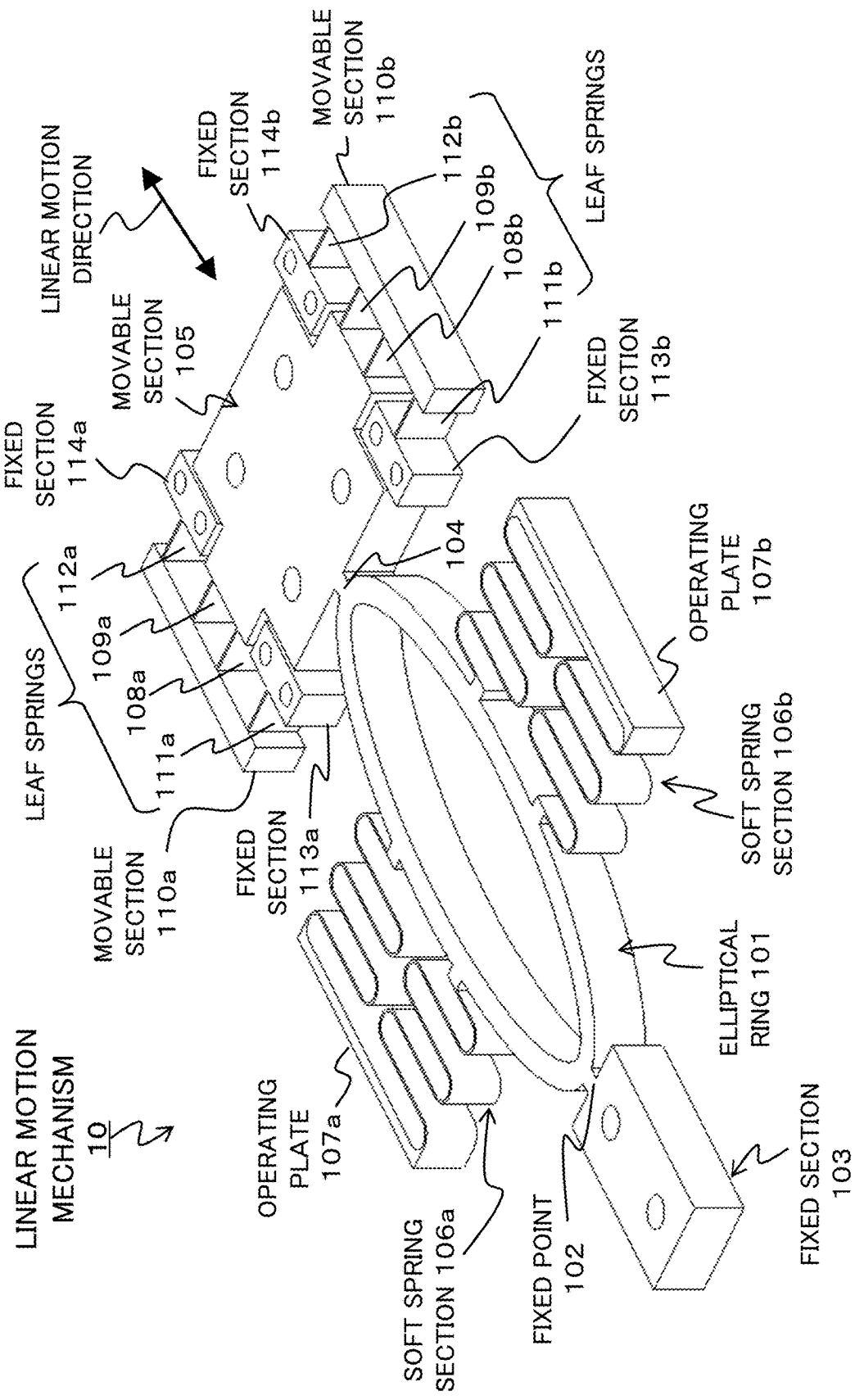
FIG. 1 is a perspective view illustrating a linear motion mechanism according to a first exemplary embodiment of the present invention.
Figure 2:
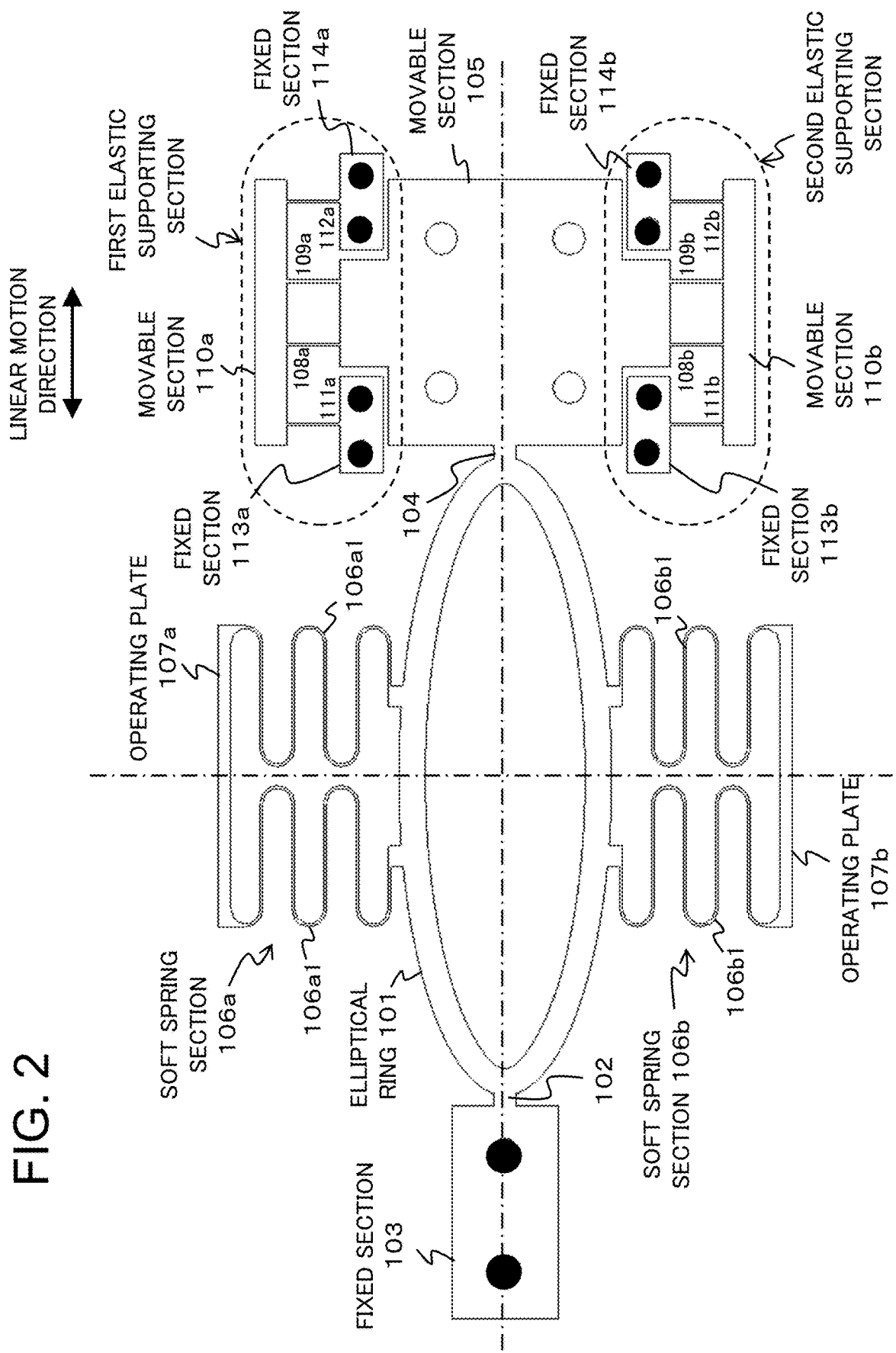
FIG. 2 is a plan view illustrating the linear motion mechanism shown in FIG. 1.

Referring to FIGS. 1 and 2, a linear motion mechanism 10 according to the first exemplary embodiment includes an elliptical ring 101 having a fixed point 102 connected to a fixed section 103 and a movable point 104 connected to a movable section 105. The fixed point 102 and the movable point 104 are both ends of the major axis of the elliptical ring 101.

The elliptical ring 101 has soft spring sections 106a and 106b which are fixed respectively to both sides of the elliptical ring 101 in the direction of the minor axis so that the elliptical ring 101 is sandwiched between the soft spring sections 106a and 106b. The respective ends of the soft spring sections 106a and 106b are provided with operating plates 107a and 107b. Preferably, the soft spring sections 106a and 106b have the same spring constant so as to press or stretch the elliptical ring 101 equally. In FIG. 1, the soft spring sections 106a and 106b are a bellows-like spring, which is merely an example.

Each of the soft spring sections 106a and 106b is preferably composed of two soft springs which are arranged in parallel with each other. More specifically, as shown in FIG. 2, the soft spring section 106a is composed of two soft springs 106a1 and 106a2, which are arranged in parallel and may be symmetric with respect to the minor axis of the elliptical ring 101. The soft spring section 106b is composed of two soft springs 106b1 and 106b2 in the same arrangement as the soft spring section 106a. This two-parallel-spring arrangement enables a self-alignment function with eliminating the effects of misalignment, allowing the movable section 105 to linearly move as intended without the need of pressing or stretching the operating plates 107a and 107b perpendicularly to their respective surfaces.

The movable section 105 is supported on both sides thereof by first and second elastic supporting sections to ensure linear motion along the major axis of the elliptical ring 101. One side of the movable section 105 is connected to a first elastic supporting section. More specifically, the movable section 105 is connected to a movable section 110a through two leaf springs 108a and 109a. The movable section 110a is further connected to fixed sections 113a and 114a through leaf springs 111a and 112a, respectively. In other words, the one side of the movable section 105 is connected to the fixed sections 113a and 114a through a first pair of leaf springs 108a and 109a and a second pair of leaf springs 111a and 112a. Similarly the other side of the movable section 105 is connected to the second elastic supporting section such that the movable section 105 is connected to the fixed sections 113b and 114b through a first pair of leaf springs 108b and 109b, a movable section 110b and a second pair of leaf springs 111b and 112b.

In this manner, both sides of the movable section 105 are supported by the first and second elastic supporting sections, respectively so that the movable section 105 stably move along the major axis of the elliptical ring 101 without swinging.

In addition, two corners on the one side of the movable section 105 are cut away so that the fixed sections 113a and 114a are partly placed within the cutaway portions, respectively. Similarly, two corners on the other side of the movable section 105 are cut away so that the fixed sections 113b and 114b are partly placed within the cutaway portions, respectively. Accordingly, the movable section 105 is movably sandwiched between the fixed sections 113a and 113b and between the fixed sections 114a and 114b, preventing the motion of the movable section 105 from excessive swinging from side to side and its excessive displacement in the direction of the major axis of the elliptical ring 101 and therefore restricting the motion of the movable section 105 within a predetermined range.

As described already, the spring constants of a pair of the soft spring sections 106a and 106b and two pairs of the leaf springs 108a and 109a and the leaf springs 111a and 112a can be selected appropriately to obtain a desired speed reduction ratio. An operation of the linear motion mechanism 10 will be described.

1.2) Operation

Figure 3:
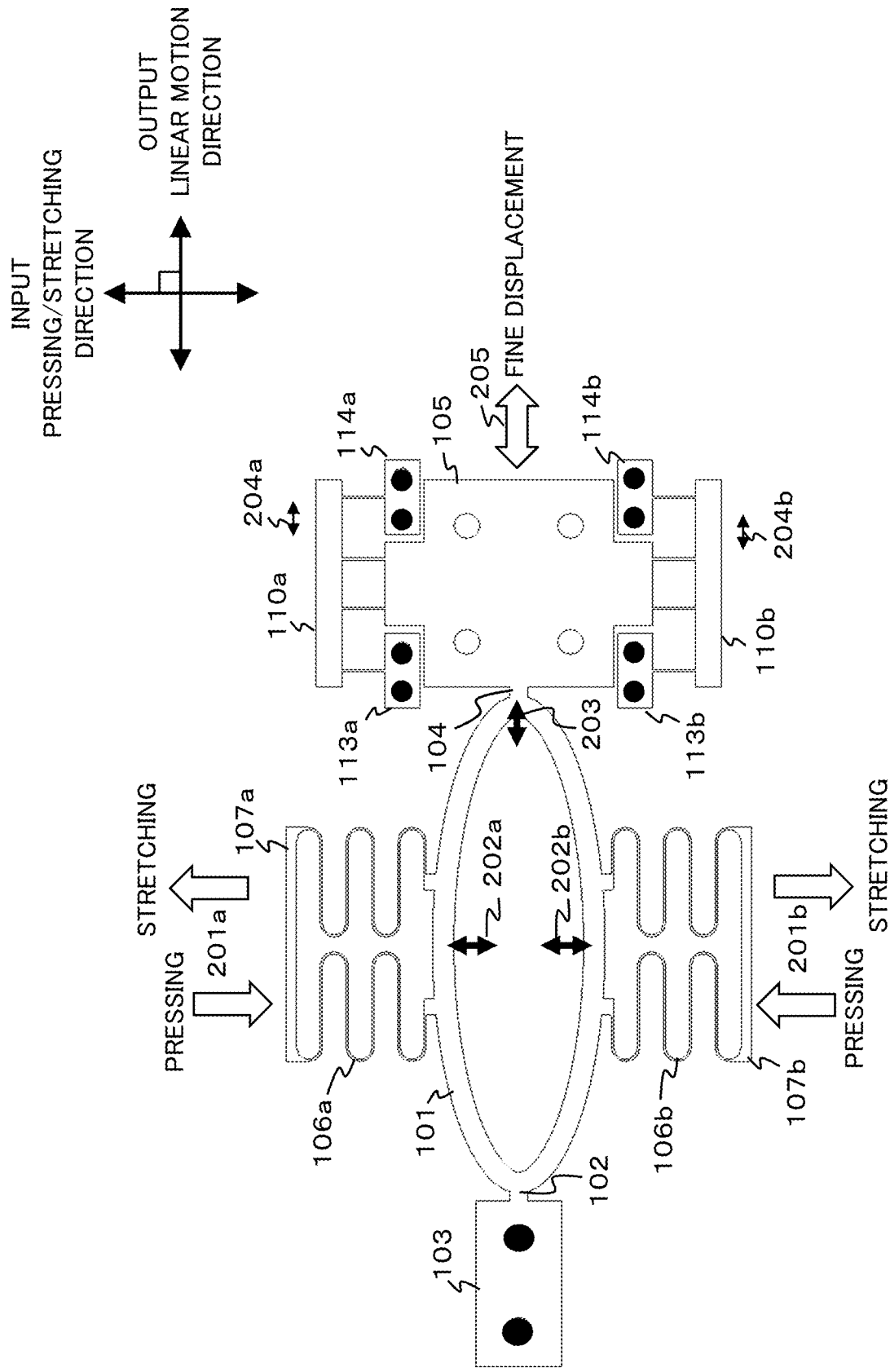
FIG. 3 is a diagram showing an operation of the linear motion mechanism shown in FIG. 1.

Referring to FIG. 3, when the soft spring sections 106a and 106b are pressed or stretched in mutually opposite input directions 201a and 201b, the elliptical ring 101 is deformed as shown by arrows 202a, 202b and 203 such that the length of the minor axis is reduced or increased and the length of the major axis is increased or reduced. Since the fixed point 102 is prevented from moving, the movable point 104 moves in the direction 203, causing the movable section 105 to slightly move in the output direction 205 while the movable sections 110a and 110b also slightly moving in the same directions 204a and 204b, respectively.

In this manner, by the soft springs 106a and 106b pressing or stretching the elliptical ring 101, the elliptical ring 101 is elastically deformed to linearly move the movable section 105 along the major axis of the elliptical ring 101. The input direction of the pressing/stretching is orthogonal to the output direction of linear motion of the movable section 105. In the case where the spring constant of the soft spring sections 106a and 106b is lower than the spring constants of the elliptical ring 101 and the leaf springs 108a, 109a, 111a, 112a, 108b, 109b, 111b and 112b, the amount of input displacement applied to the soft spring sections 106a and 106b can be transformed to a desired amount of linear motion of the movable section 105.

As described above, the linear motion mechanism 10 is allowed to operate on the same flat surface, resulting in enhanced miniaturization and structural strength as well as easy operation.

1.3) Production

Figure 4:
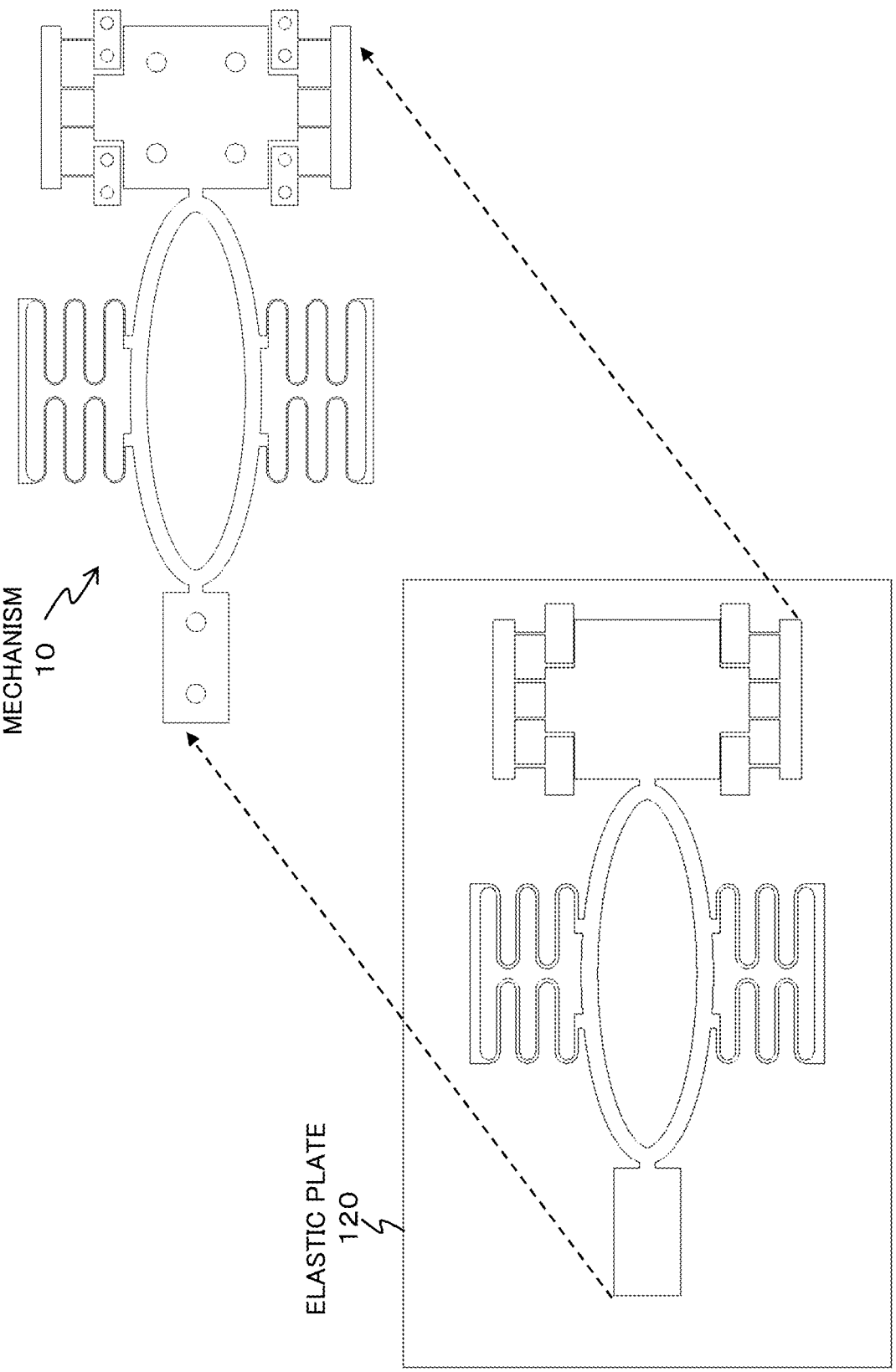
FIG. 4 is a schematic diagram showing an example of the production process of a linear motion mechanism as shown in FIG. 1.

As illustrated in FIG. 4, all sections 101-114 of the linear motion mechanism 10 may be formed integrally by cutting its plane structural shape from a single elastic plate 120 with a homogenous material having a predetermined thickness. Accordingly, the linear motion mechanism 10 has a two-dimensional structure with all sections 101-114 having the same thickness, allowing easy reduction in weight and size and simple production. Another technology such as injection molding, 3-dimentional printer or MEMS (Micro Electro Mechanical Systems) may be employed for production of the linear motion mechanism 10.

1.4) Advantageous Effects

According to the first exemplary embodiment of the present invention, larger input displacement of the soft spring sections is transformed to smaller linear motion of the movable section according to a spring constant ratio. Accordingly, even whether the input displacement is applied to the soft spring sections with less precision, the linear motion mechanism can provide linear motion with greater precision. If the spring constant ratio is previously known, the amount of displacement of the movable section can be calculated with precision by precisely measuring the input displacement of the soft springs without precisely measuring the displacement of the movable section. Accordingly, the first exemplary embodiment of the present invention can achieve nano-resolution motion of the movable section.

In addition, as described above, each section of the linear motion mechanism 10 moves due to the Nature of Motion through the monocoque design with homogenous materials and without any passages via sliding mechanisms, resulting in no potential motion losses and achieving the followings:
i. Absolutely predictable and repeatable motions;
ii. Precise motion without complex position sensors and close-loop servo control, therefore enabling an open-loop control;
iii. Perfectly working in a wide temperature ranges, cryogenic to the upper 400° C. or even more;
iv. Semi-permanent life without the need of considerations of the pressing/stretching mechanisms (input mechanisms);
v. Zero particle and zero cross contamination; and
vi. High resistance to corrosive conditions such as being submerged in the corrosive gases and liquid.

2. Second Exemplary Embodiment

2.1) Structure

Figure 5:
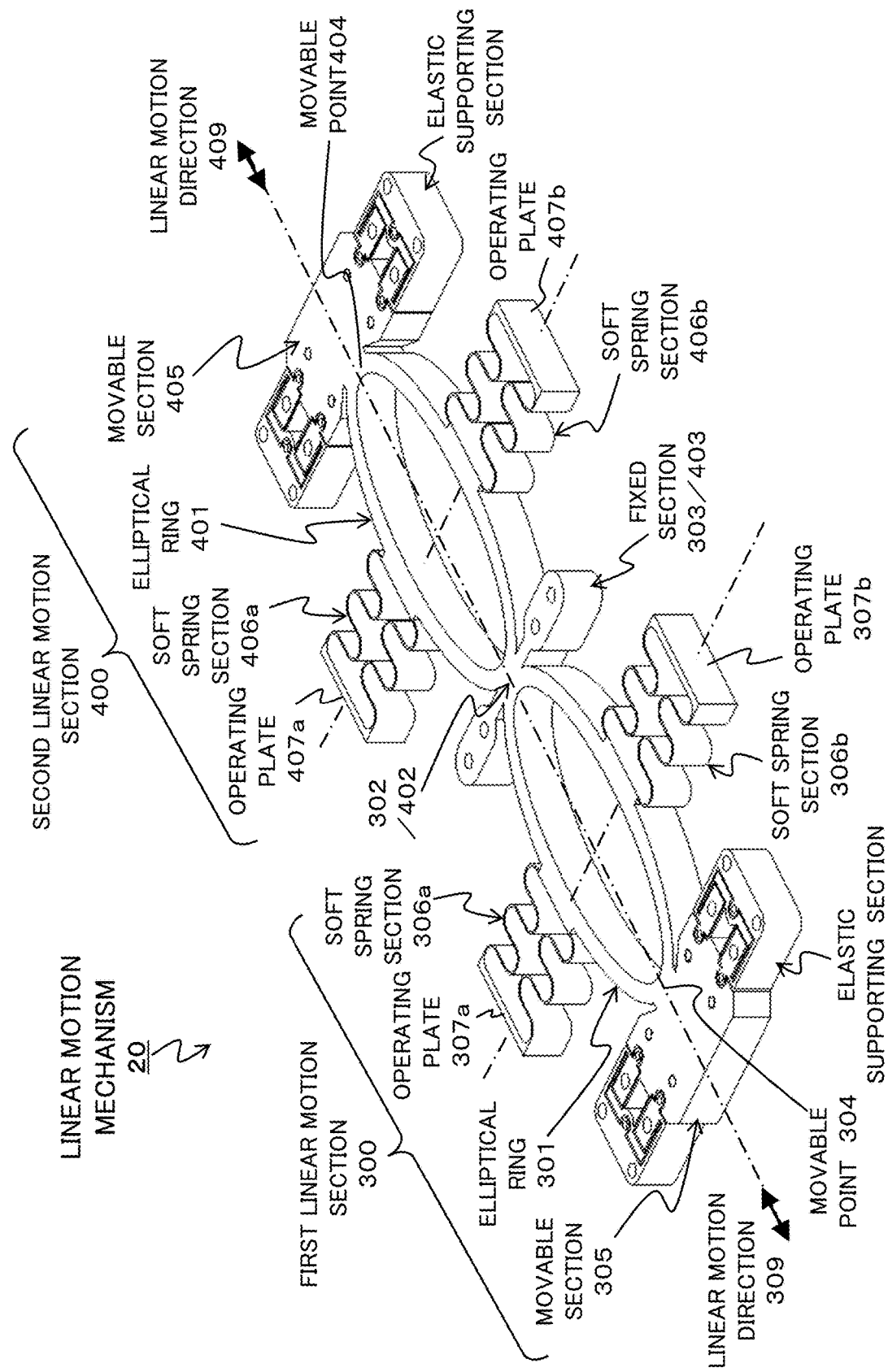
FIG. 5 is a perspective view illustrating a linear motion mechanism according to a second exemplary embodiment of the present invention.
Figure 6:
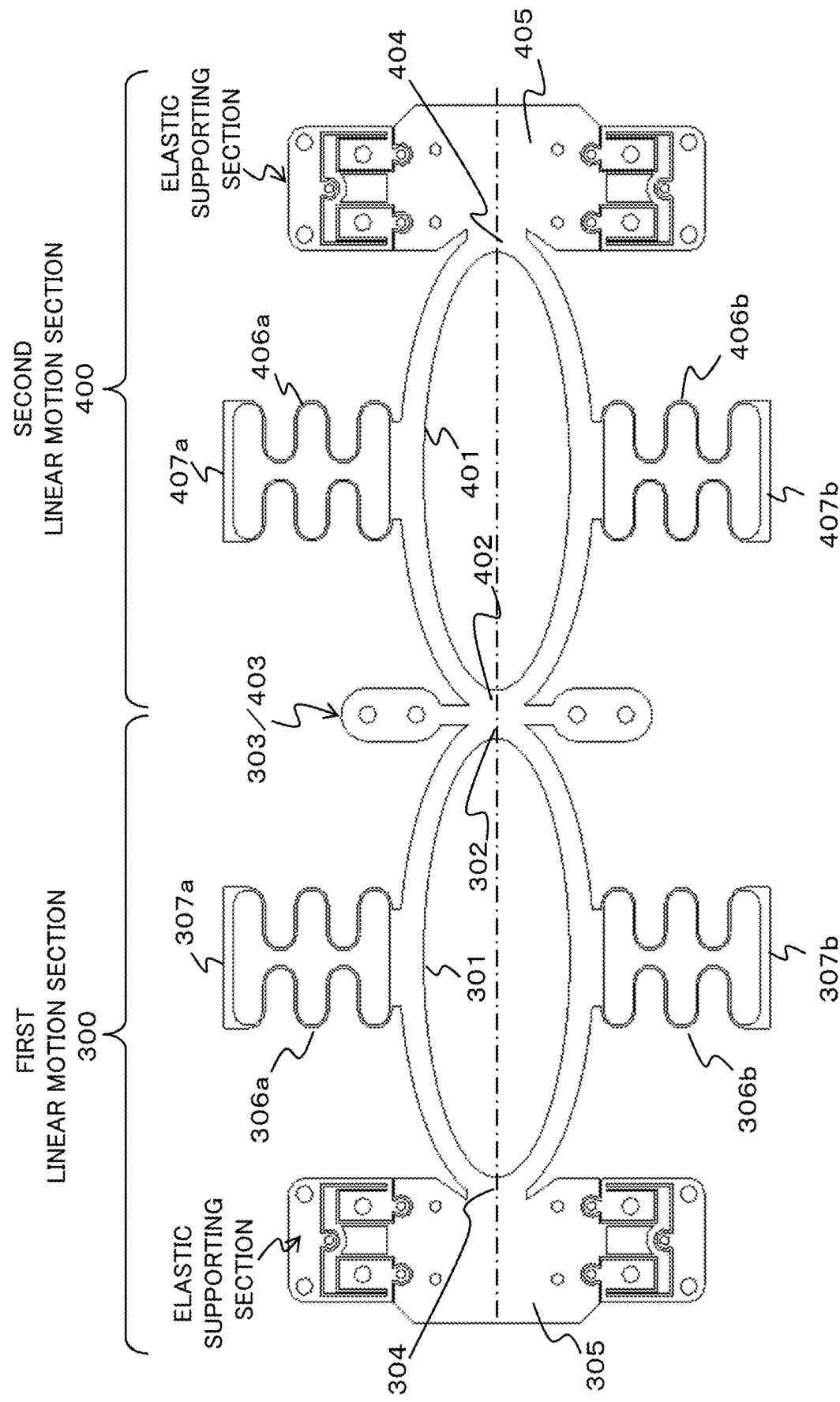
FIG. 6 is a plan view illustrating the linear motion mechanism shown in FIG. 5.

As shown in FIGS. 5 and 6, a linear motion mechanism 20 according to the second exemplary embodiment is formed by a combination of first linear motion section 300 and second linear motion section 400, each of which has the substantially same functional structure as the linear motion mechanism 10 as shown in FIGS. 1 and 2. The first linear motion section 300 and the second linear motion section 400 are arranged such that the major axes of the elliptical rings 301 and 401 are in alignment with each other. The first linear motion section 300 and the second linear motion section 400 have a common fixed section 303/403 corresponding to the fixed section 103 of the first exemplary embodiment. Accordingly, the linear motion mechanism 20 provides movable sections 305 and 405 respectively on its both sides.

More specifically, the first linear motion section 300 includes an elliptical ring 301 having a fixed point 302 connected to a fixed section 303 and a movable point 304 connected to a movable section 305. The fixed point 302 and the movable point 304 are both ends of the major axis of the elliptical ring 301.

The elliptical ring 301 has soft spring sections 306a and 306b which are connected on both sides of the elliptical ring 301 in the direction of the minor axis, respectively. The respective ends of the soft spring sections 306a and 306b are provided with operating plates 307a and 307b. Preferably, the soft spring sections 306a and 306b have the same spring constant so as to press or stretch the elliptical ring 301 equally. In FIG. 5, the soft spring sections 306a and 306b are a bellows-like spring, which is merely an example. Each of the soft spring sections 306a and 306b has the two-parallel-spring arrangement similar to the soft spring sections 106a and 106b of the first exemplary embodiment.

The movable section 305 is supported on both sides thereof by elastic supporting section to ensure linear motion along the major axis of the elliptical ring 301. The elastic supporting section is similar to the first and second elastic supporting sections of the first exemplary embodiment and therefore the detailed descriptions are omitted. Since the respective sides of the movable section 105 are supported by the elastic supporting section, the movable section 305 stably move along the major axis of the elliptical ring 301 without swinging.

As described already, the spring constants of a pair of the soft spring sections 306a and 306b and the elastic supporting section can be selected appropriately to obtain a desired speed reduction ratio.

The structure of the second linear motion section 400 is similar to that of the first linear motion section 300. In brief, the second linear motion section 400 includes an elliptical ring 401 having a fixed point 402 connected to a fixed section 403 and a movable point 404 connected to a movable section 405. The fixed point 402 and the movable point 404 are both ends of the major axis of the elliptical ring 401. The elliptical ring 401 has soft spring sections 406a and 406b which are connected on both sides of the elliptical ring 401 in the direction of the minor axis, respectively. The respective ends of the soft spring sections 406a and 406b are provided with operating plates 407a and 407b. The movable section 405 is supported on both sides thereof by elastic supporting section to ensure linear motion along the major axis of the elliptical ring 401.

2.2) Operation

Figure 7:
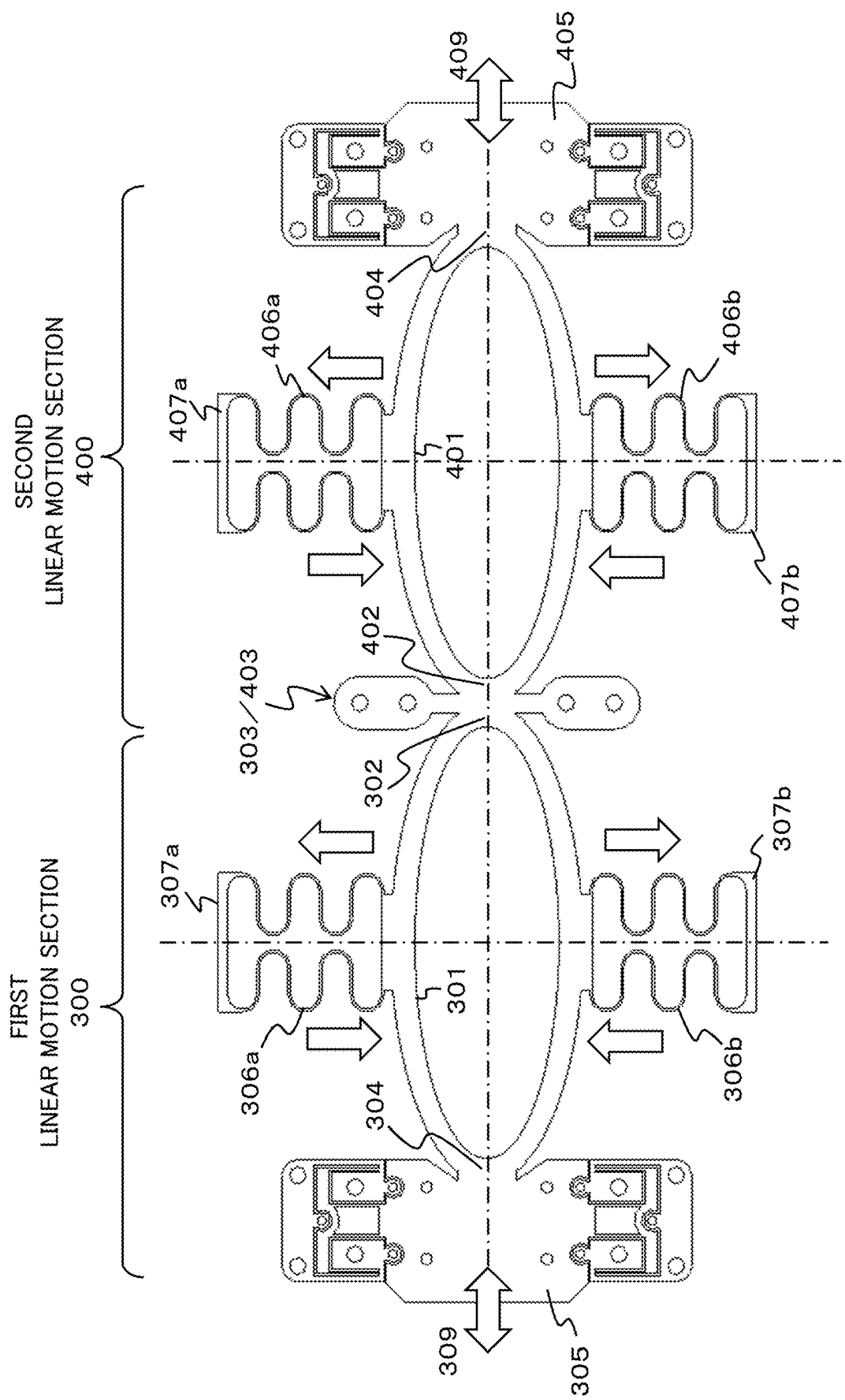
FIG. 7 is a diagram showing an operation of the linear motion mechanism shown in FIG. 5.

As shown in FIG. 7, the operating plates 307a and 307b are operated in the opposite directions, causing the soft springs 306a and 306b concurrently to be pressed or stretched as mentioned in the first exemplary embodiment. Similarly, the operating plates 407a and 407b are operated in the same manner as, but independently of the operating plates 307a and 307b. Accordingly, when the soft spring sections 306a and 306b and the soft spring sections 406a and 406b are pressed or stretched, the elliptical rings 301 and 401 are deformed to move the movable sections 305 and 405 in the directions 309 and 409, respectively.

In this manner, by the operating plates 307a and 307b and the operating plates 407a and 407b elastically deforming the elliptical rings 301 and 401, respectively, the movable sections 305 and 405 are linearly moved along the major axis of the elliptical rings 301 and 401.

The direction of pressing/stretching the soft spring sections is orthogonal to the direction of linear motion of the movable sections 305 and 405. In the case where the spring constant of the soft spring sections 306a, 306b, 406a and 406b is lower than the spring constants of the elliptical rings 301 and 401 and the elastic supporting sections, the amount of input displacement applied to the soft springs 306a, 306b, 406a and 406b can be transformed to a desired amount of linear motion of the movable sections 305 and 405. Accordingly, the linear motion mechanism 20 can provide the advantageous effects similar to the first exemplary embodiment.

2.3) Production

Similarly to the first exemplary embodiment as shown in FIG. 4, all sections of the linear motion mechanism 20 may be also formed integrally, for example, by cutting its plane structural shape from a single elastic plate having a predetermined thickness. Accordingly, it is possible to produce the linear motion mechanism 20 having a two-dimensional structure with all sections having the same thickness, allowing easy reduction in weight and size and simple production. Another technology such as injection molding, 3-dimentional printer or MEMS (Micro Electro Mechanical Systems) may be employed for production of the linear motion mechanism 10.

3. Applications

3.1) Adjustable Support Assembly

3.1.1) Structure

Figure 8:
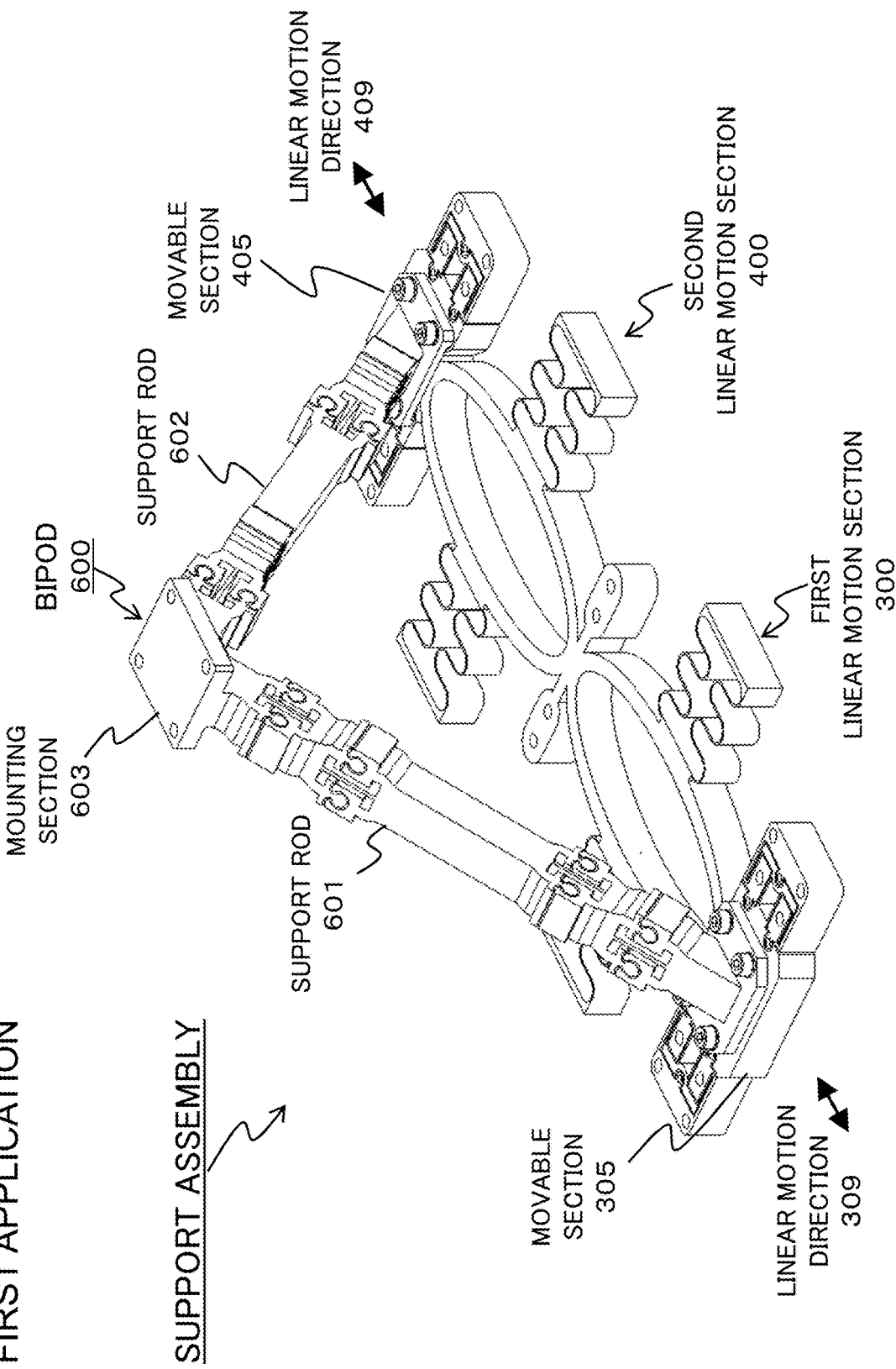
FIG. 8 is a perspective view illustrating a first application of the linear motion mechanism according to the second exemplary embodiment of the present invention.

Referring to FIG. 8, a support assembly is composed of a bipod 600 and the linear motion mechanism 20 as described in the second exemplary embodiment. The bipod 600 has two support rods 601 and 602, one ends of which are connected at a top provided with a support section 603 to form an upside-down V-shaped bipod. The other ends of the support rods 601 and 602 are fixed to the movable section 305 of the first linear motion section 300 and the movable section 405 of the second linear motion section 400, respectively. The support rods 601 and 602 have the same structure. Hereinafter, the structure of the support rod 601 shown in FIGS. 9-11 will be described as an example.

3.1.2) Bipod

Figure 9:
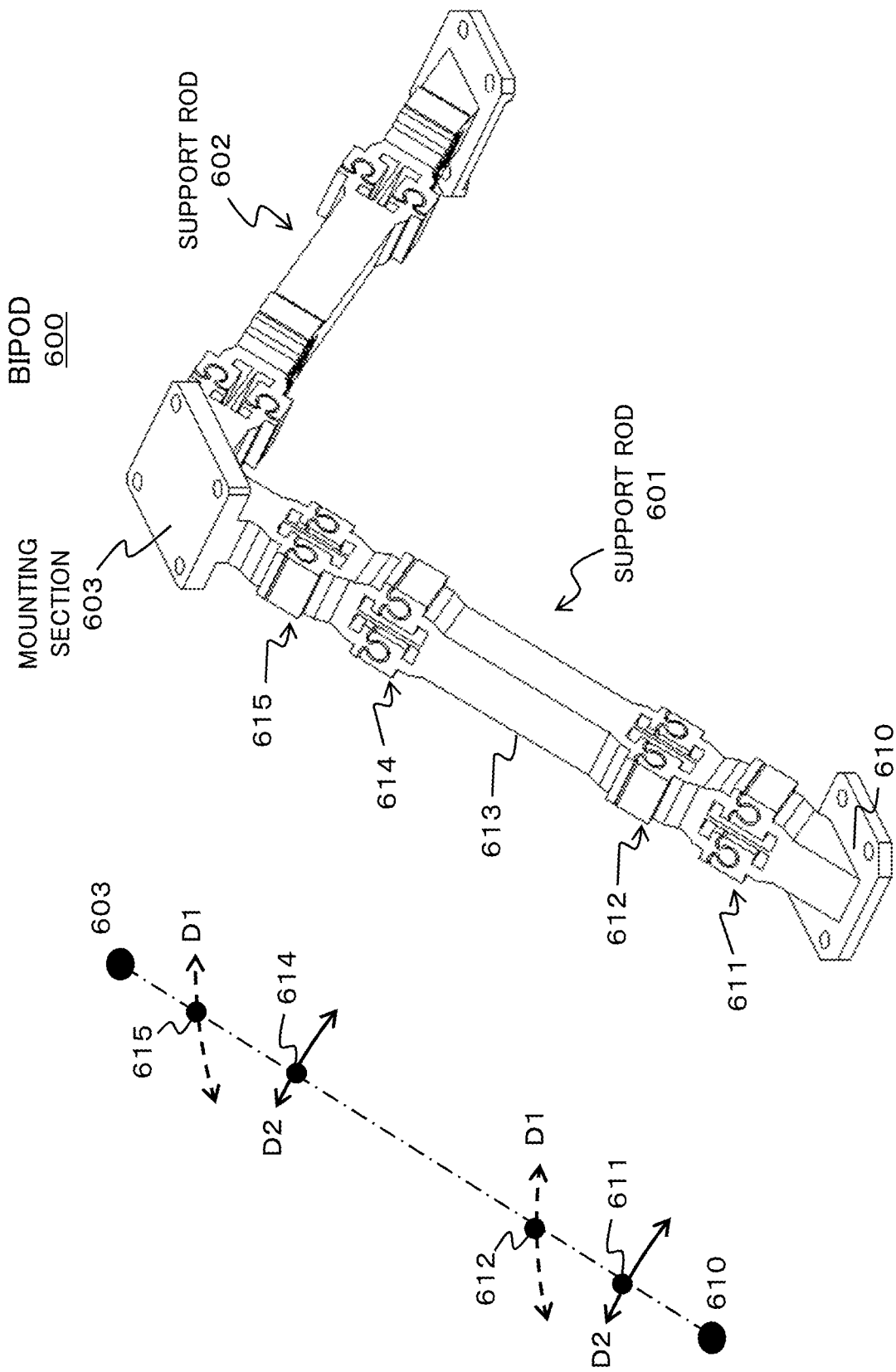
FIG. 9 is a perspective view of a bipod employed in the first application as shown in FIG. 8.
Figure 10:
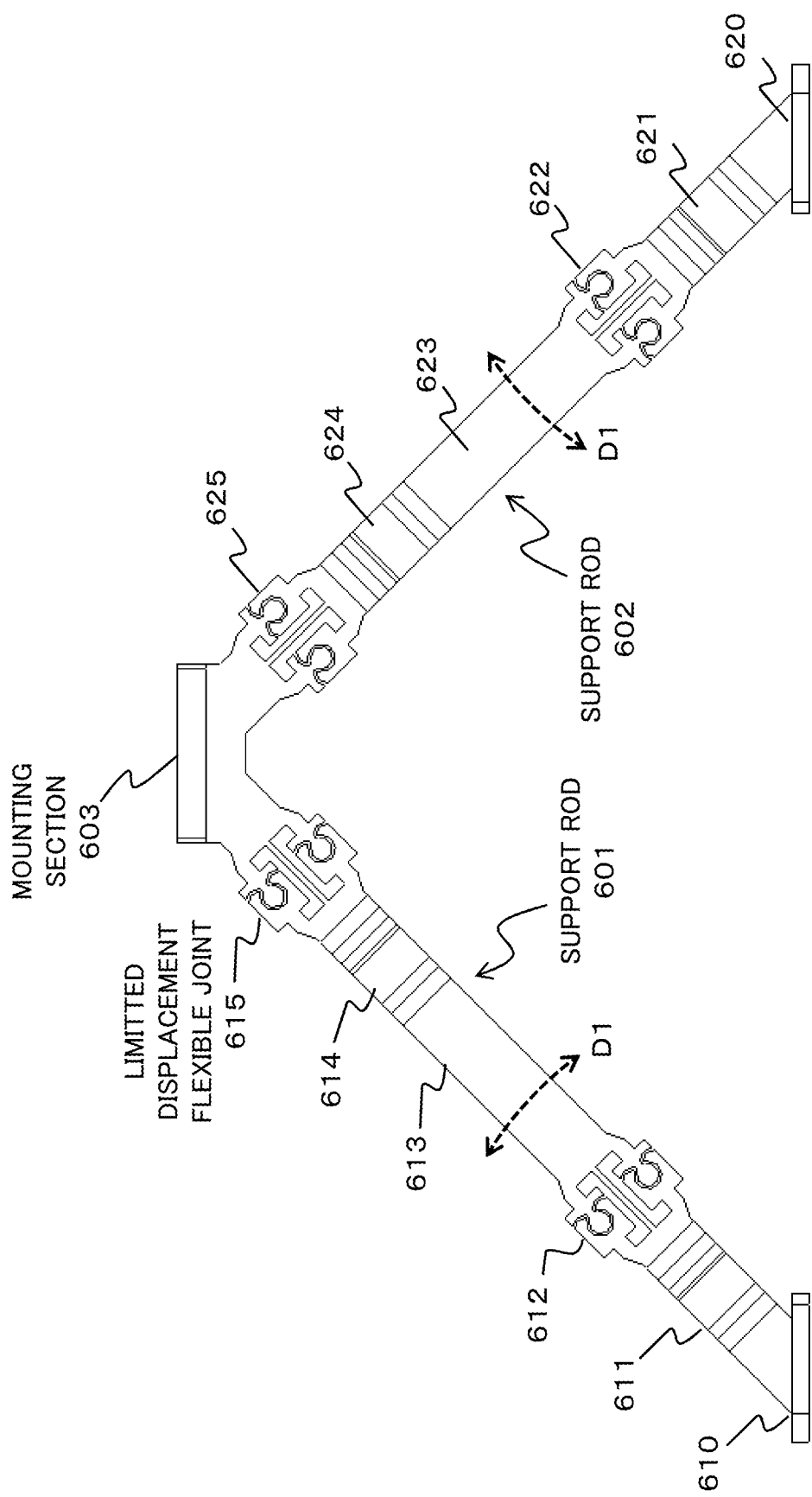
FIG. 10 is a side view of the bipod as shown in FIG. 9.
Figure 11:
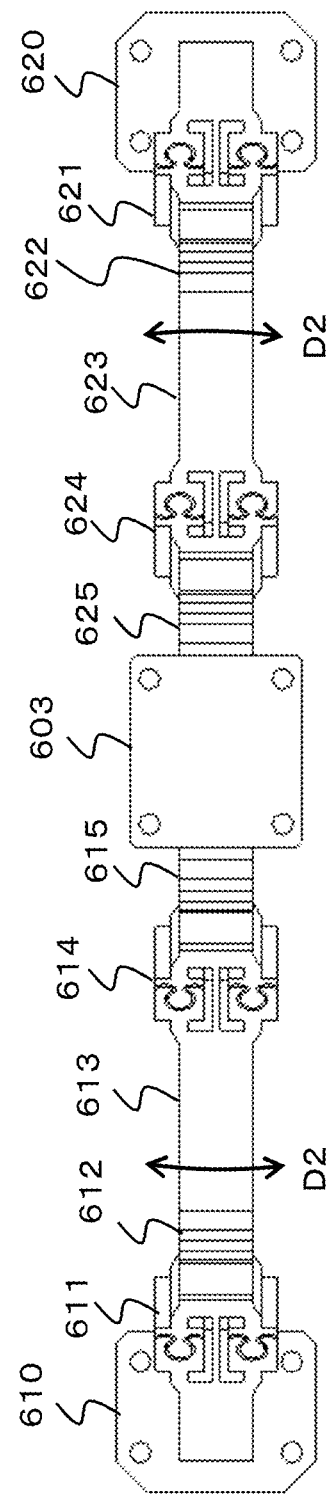
FIG. 11 is a plan view of the bipod as shown in FIG. 9.

Referring to FIGS. 9-11, the support rod 601 is shaped like a leg including a fixed portion 610, two limited-displacement flexible joints 611 and 612, a relatively rigid rod 613, and two limited-displacement flexible joints 614 and 615. Each of the limited-displacement flexible joints 611, 612, 614 and 615 provides limited flexibility in a direction alternating between orthogonal flexible directions D1 and D2 with respect to the longitudinal axis of the support rod 601. The flexible direction D1 is a direction orthogonal to the support rod 601 in a plane formed by the support rods 601 and 602, which is typically illustrated in FIG. 10. The flexible direction D2 is a direction orthogonal to the plane formed by the support rods 601 and 602, which is typically illustrated in FIG. 11. In the present example, the limited-displacement flexible joints 611 and 614 are allowed to curve in the direction D2 while the limited-displacement flexible joints 612 and 615 are allowed to curve in the direction D1. Accordingly, the support rod 601 can freely curve in the directions D1 and D2. Similarly, the support rod 602 is shaped like a leg including a fixed portion 620, two limited-displacement flexible joints 621 and 622, a relatively rigid rod 623, and two limited-displacement flexible joints 624 and 625 and can freely curve in orthogonal flexible directions D1 and D2 with respect to the longitudinal axis of the support rod 602.

However, each of the limited-displacement flexible joints 611, 612, 614, 615, 621, 622, 624 and 625 is designed to limit the degree of bending so as to prevent breakage of the joint. The detailed structure of a limited-displacement flexible joint will be described with references to FIGS. 12-14.

Figure 12:
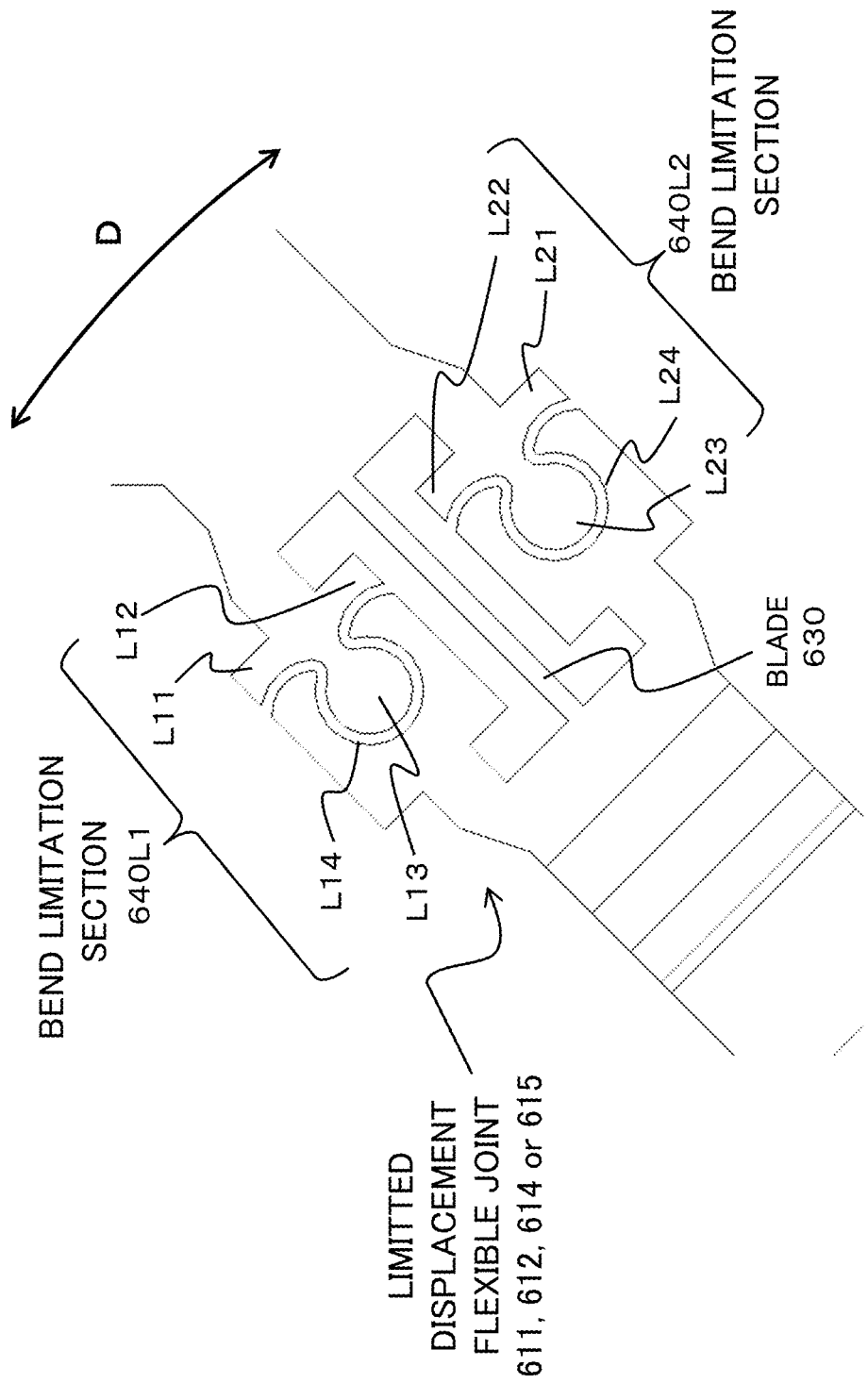
FIG. 12 is an enlarged side view of a limited-displacement flexible joint of the bipod as shown in FIG. 9.

Referring to FIG. 12, the limited-displacement flexible joint is composed of a flexible blade 630 and a pair of bend limitation sections 640L1 and 640L2 which are provided on both sides of the flexible blade 630 in parallel to form a single joint. The flexible blade 630 provides flexibility as described above. Each of the bend limitation sections 640L1 and 640L2 is composed of two separate parts which are engaged with clearance to rotate around the axis vertical to the paper surface (as indicated by D). More specifically, one of the parts (an upper part) of the bend limitation sections 640L1 is composed of a pair of outer stopper L11 and inner stopper L12 protruding from the upper part and a cylindrically shaped protrusion L13 provided at the edge of the upper part. The other of the parts (a lower part) of the bend limitation sections 640L1 is composed of a cylindrically shaped recess L14 which is rotatably engaged with the cylindrically shaped protrusion L13. The bend limitation sections 640L2 has the same structure as the bend limitation sections 640L1. More specifically, one of the parts (an upper part) of the bend limitation sections 640L2 is composed of a pair of outer stopper L21 and inner stopper L22 protruding from the upper part and a cylindrically shaped protrusion L23 provided at the edge of the upper part. The other of the parts (a lower part) of the bend limitation sections 640L2 is composed of a cylindrically shaped recess L24 which is rotatably engaged with the cylindrically shaped protrusion L23.

Figure 13:
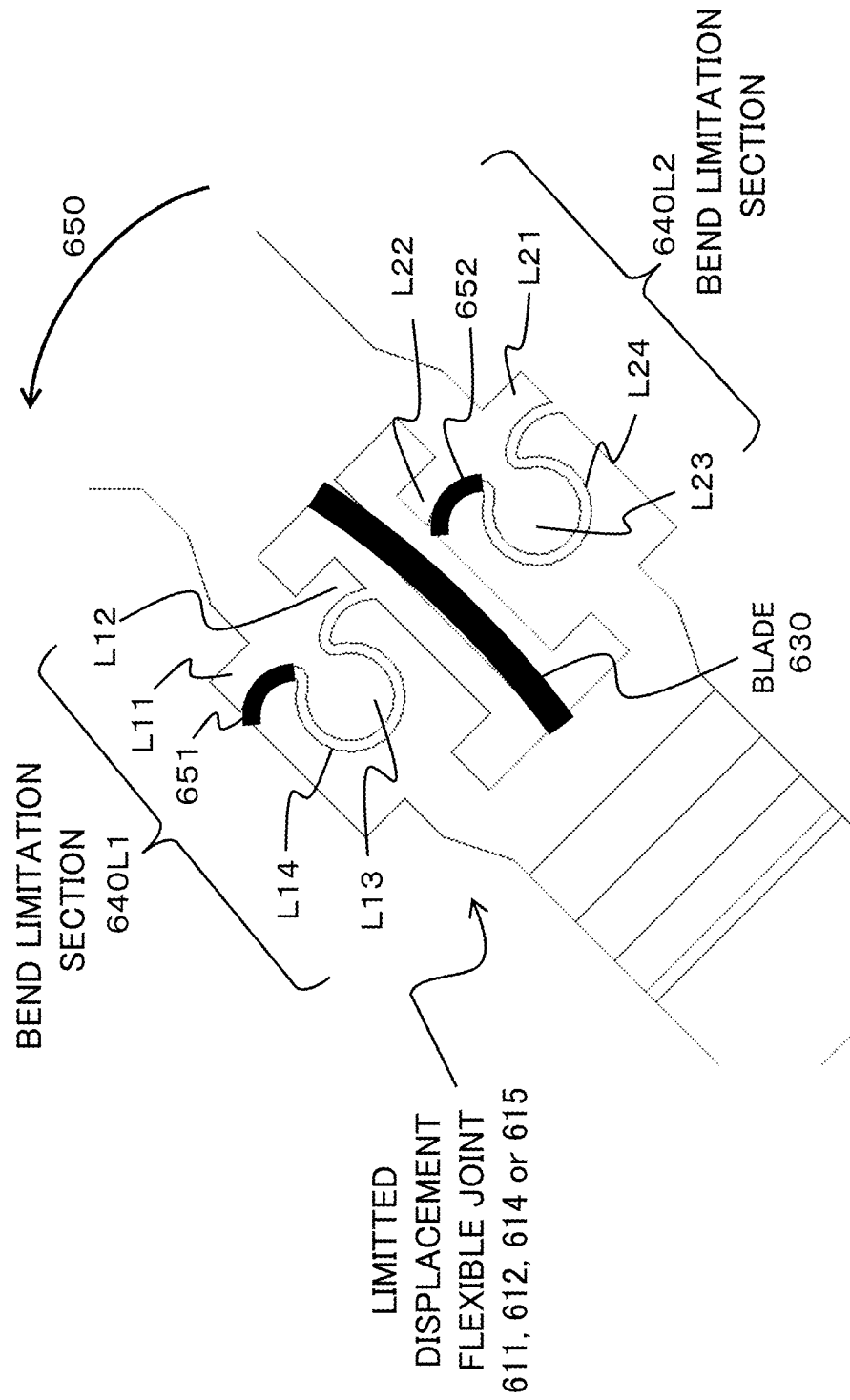
FIG. 13 is an enlarged side view of the limited-displacement flexible joint as shown in FIG. 12 in the case of being curved in one direction.

As shown in FIG. 13, when the support rod bends in the direction 650, the blade 630 also curve in the same direction 650, rotating the upper parts of the bend limitation sections 640L1 and 640L2 with respect to their lower parts, respectively. The respective rotations cause the stoppers L11 and L22 to be contacted on one top edges of the cylindrically shaped recesses L14 and L24 as indicated by reference numerals 651 and 652. Accordingly, the rotation of the upper part in the direction 650 is stopped tightly, preventing breakage of the blade 630.

Figure 14:
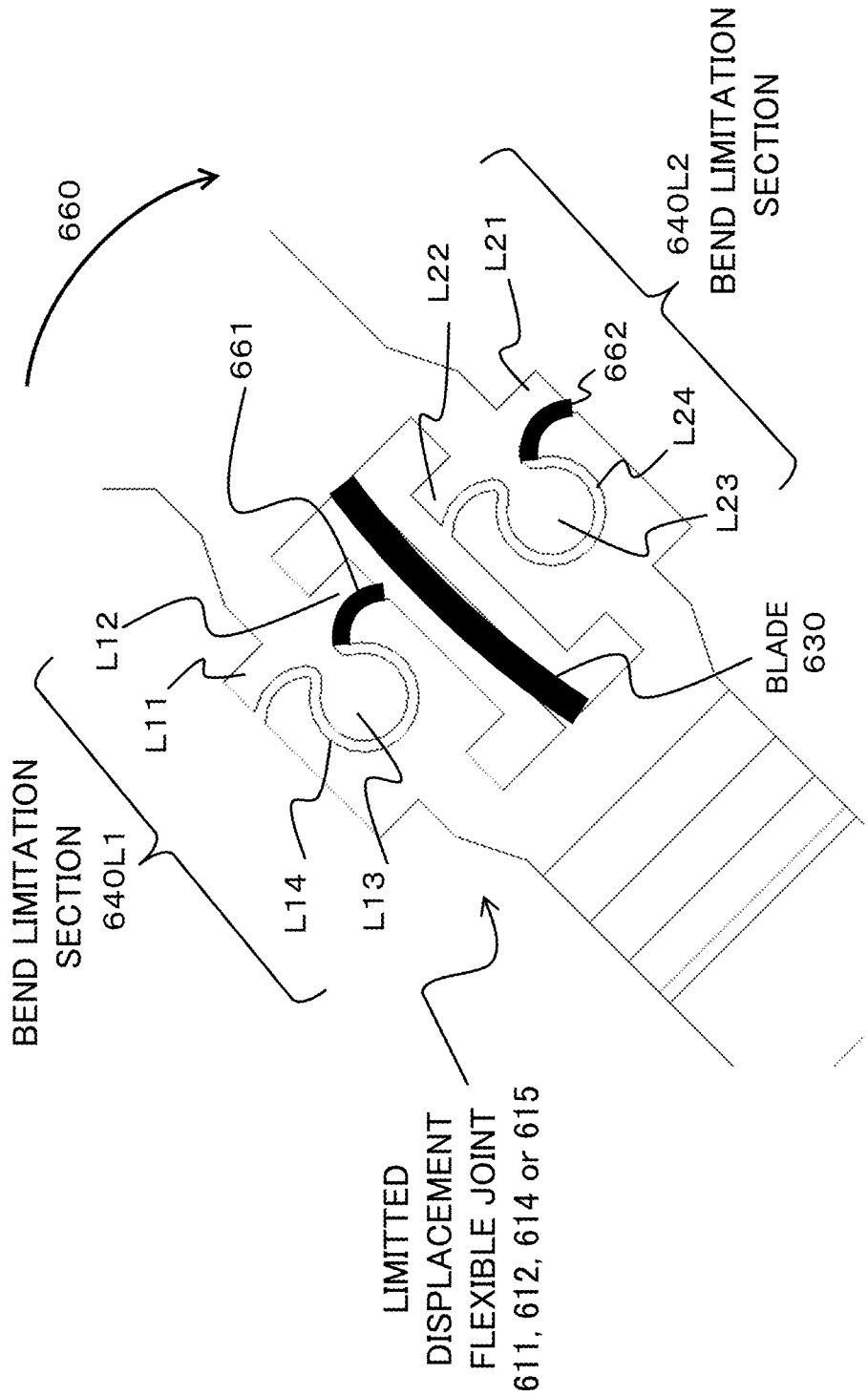
FIG. 14 is an enlarged side view of the limited-displacement flexible joint as shown in FIG. 12 in the case of being curved in the other direction.

As shown in FIG. 14, when the support rod bends in the opposite direction 660, the blade 630 also curve in the same direction 660, rotating the upper parts of the bend limitation sections 640L1 and 640L2 with respect to the lower parts, respectively. The respective rotations cause the stoppers L12 and L21 to be contacted on the other top edges of the cylindrically shaped recesses L14 and L24 as indicated by reference numerals 661 and 662. Accordingly, the rotation of the upper part in the direction 660 is also stopped tightly, preventing breakage of the blade 630.

3.1.3) Operation

Figure 15:
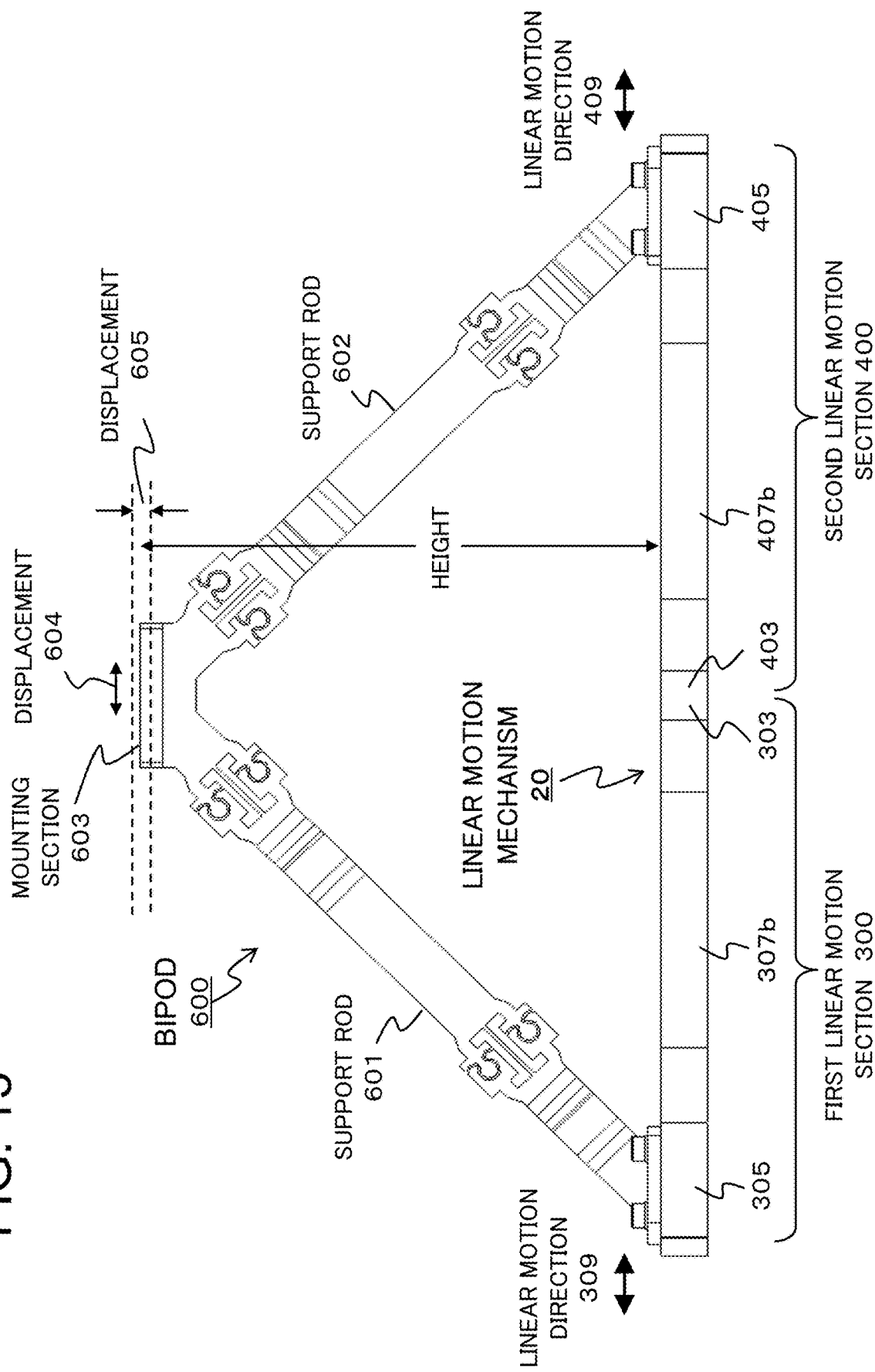
FIG. 15 is a side view of the first application as shown in FIG. 8.

Referring to FIG. 15, the support assembly is assembled from the bipod 600 and the linear motion mechanism 20. The support rods 601 and 602 are fixed to the movable section 305 of the first linear motion section 300 and the movable section 405 of the second linear motion section 400, respectively. Accordingly, the support section 603 of the bipod 600 can be moved to an arbitrary position within a limited range on a plane formed by the support rods 601 and 602 depending on the respective directions and displacements of linear motion of the movable sections 305 and 405.

Figure 16A:
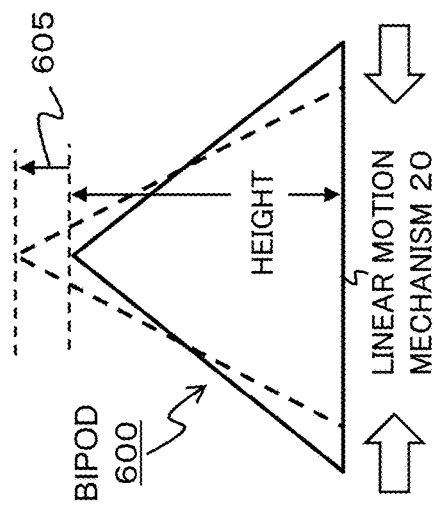
FIGS. 16A-16D are a schematic side-view structure of the first application as shown in FIG. 8 for explaining operations of the first application.

As shown in FIG. 16A, when the operating plates 307a and 307b and the operating plates 407a and 407b press the elliptical rings 301 and 401 respectively so that the linear motion mechanism 20 moves the movable sections 305 and 405 by the same displacement in the mutually opposite directions broadening the distance between the movable sections 305 and 405, the height of the bipod 600 with respect to the main surface of the linear motion mechanism 20 is reduced depending on the displacement of the movable sections 305 and 405 as indicated by displacement 605 perpendicular to the main surface of the linear motion mechanism 20.

Figure 16B:
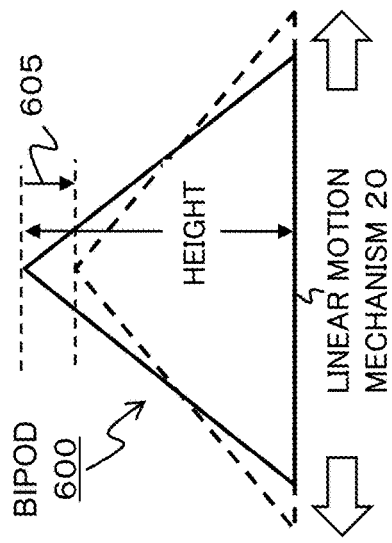

As shown in FIG. 16B, when the operating plates 307a and 307b and the operating plates 407a and 407b stretch the elliptical rings 301 and 401 respectively so that the linear motion mechanism 20 moves the movable sections 305 and 405 by the same displacement in the mutually opposite directions reducing the distance between the movable sections 305 and 405, the height of the bipod 600 with respect to the main surface of the linear motion mechanism 20 is increased depending on the displacement of the movable sections 305 and 405 as indicated by displacement 605 perpendicular to the surface of the linear motion mechanism 20.

Figure 16C:
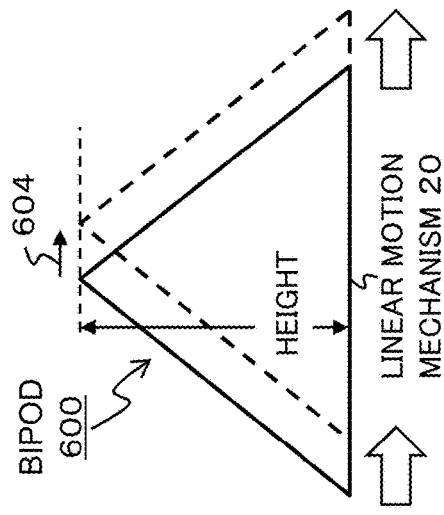
Figure 16D:
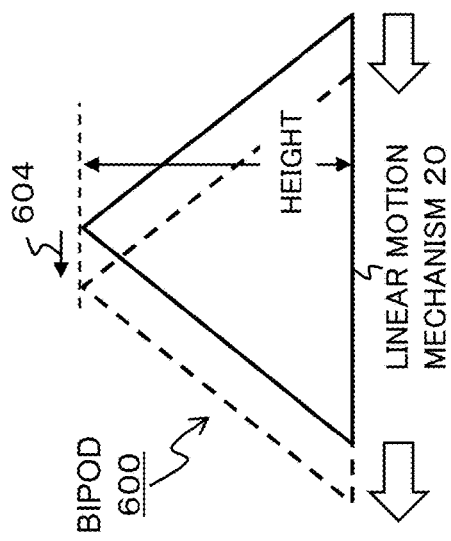
Figure 18:
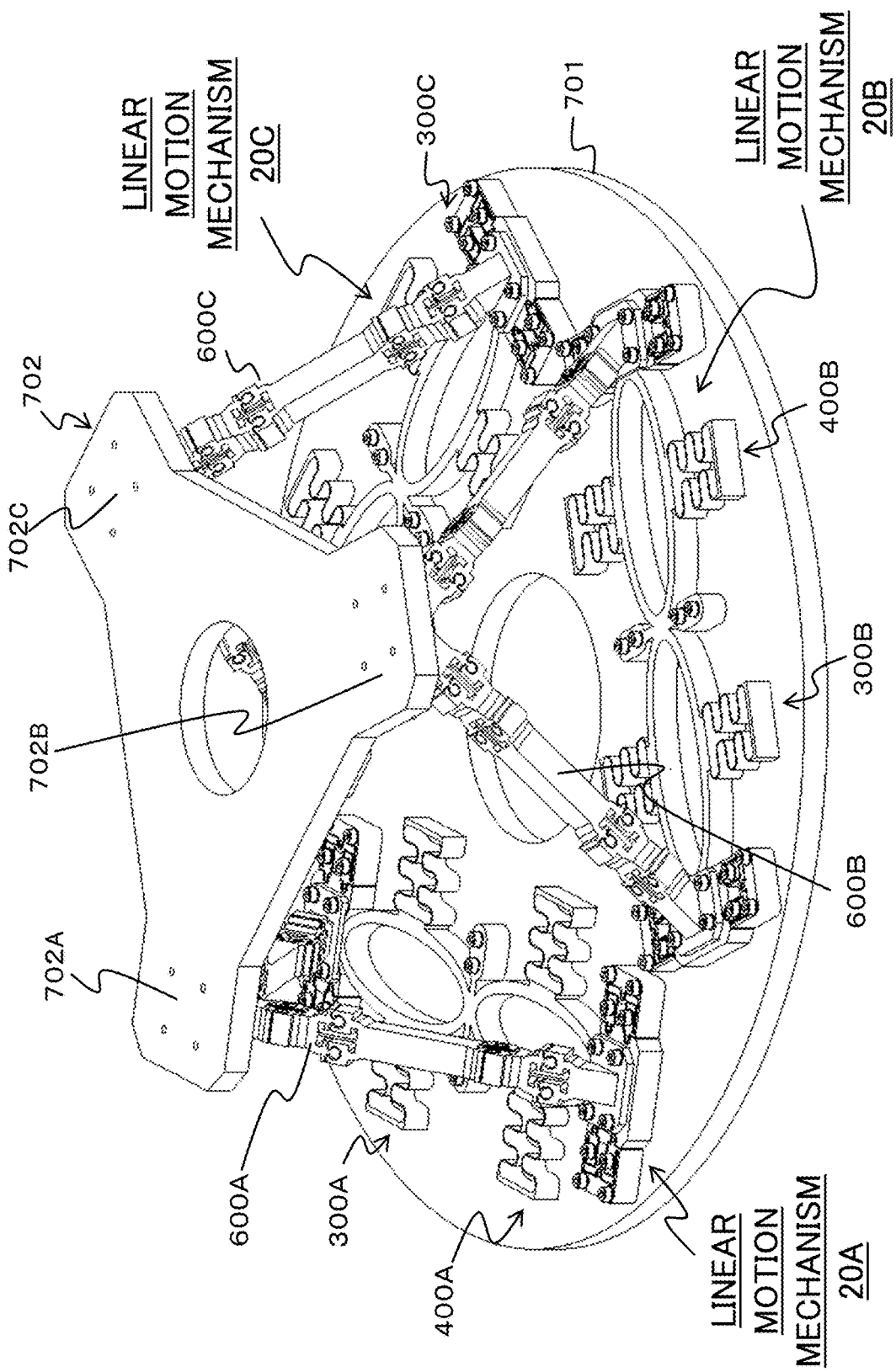
FIG. 18 is a perspective view illustrating the second application as shown in FIG. 17.
Figure 19:
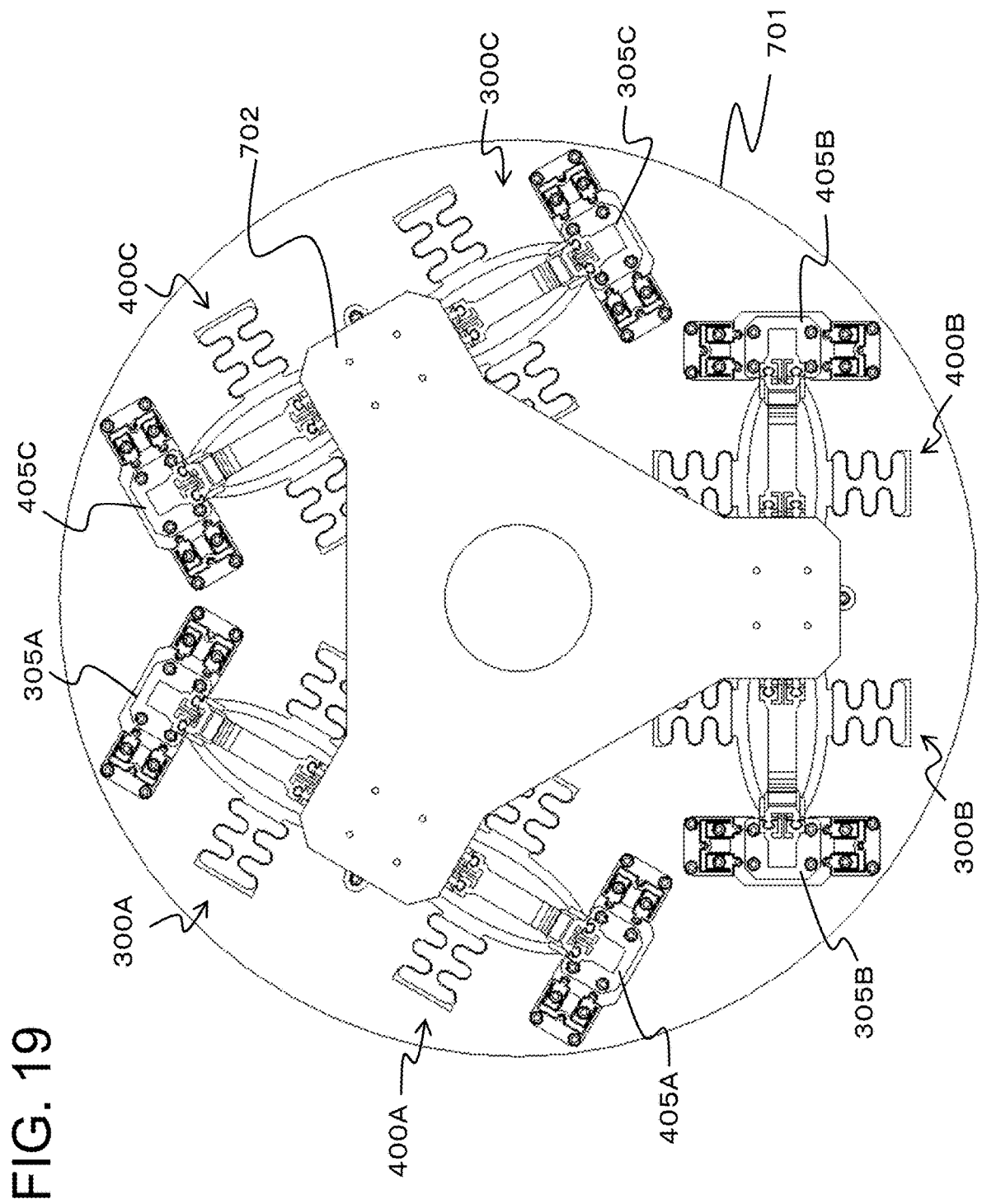
FIG. 19 is a plan view illustrating the second application as shown in FIG. 17.
Figure 20:
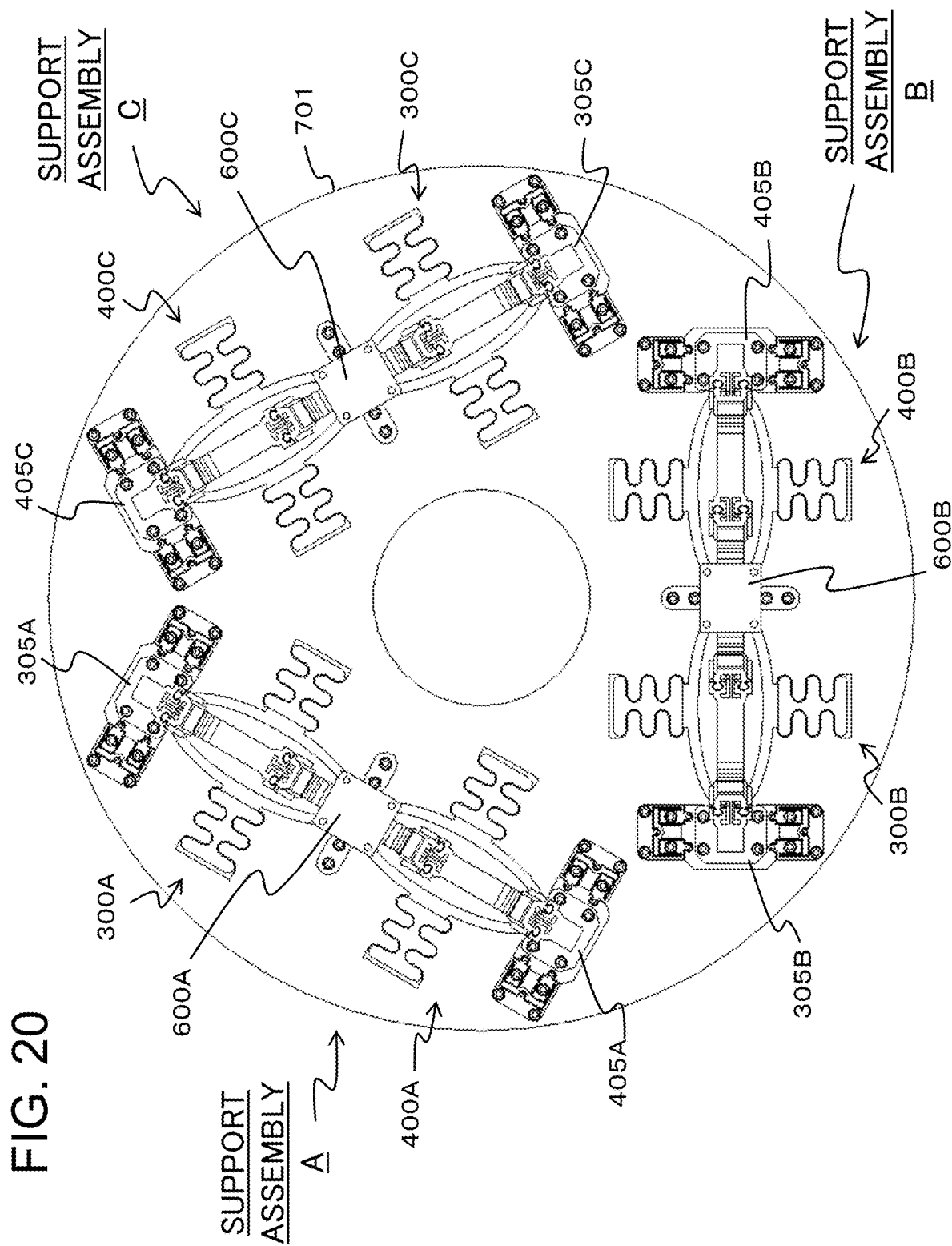
FIG. 20 is a plan view illustrating the second application as shown in FIG. 17 in a state such that a mounting base has been removed.
Figure 21:
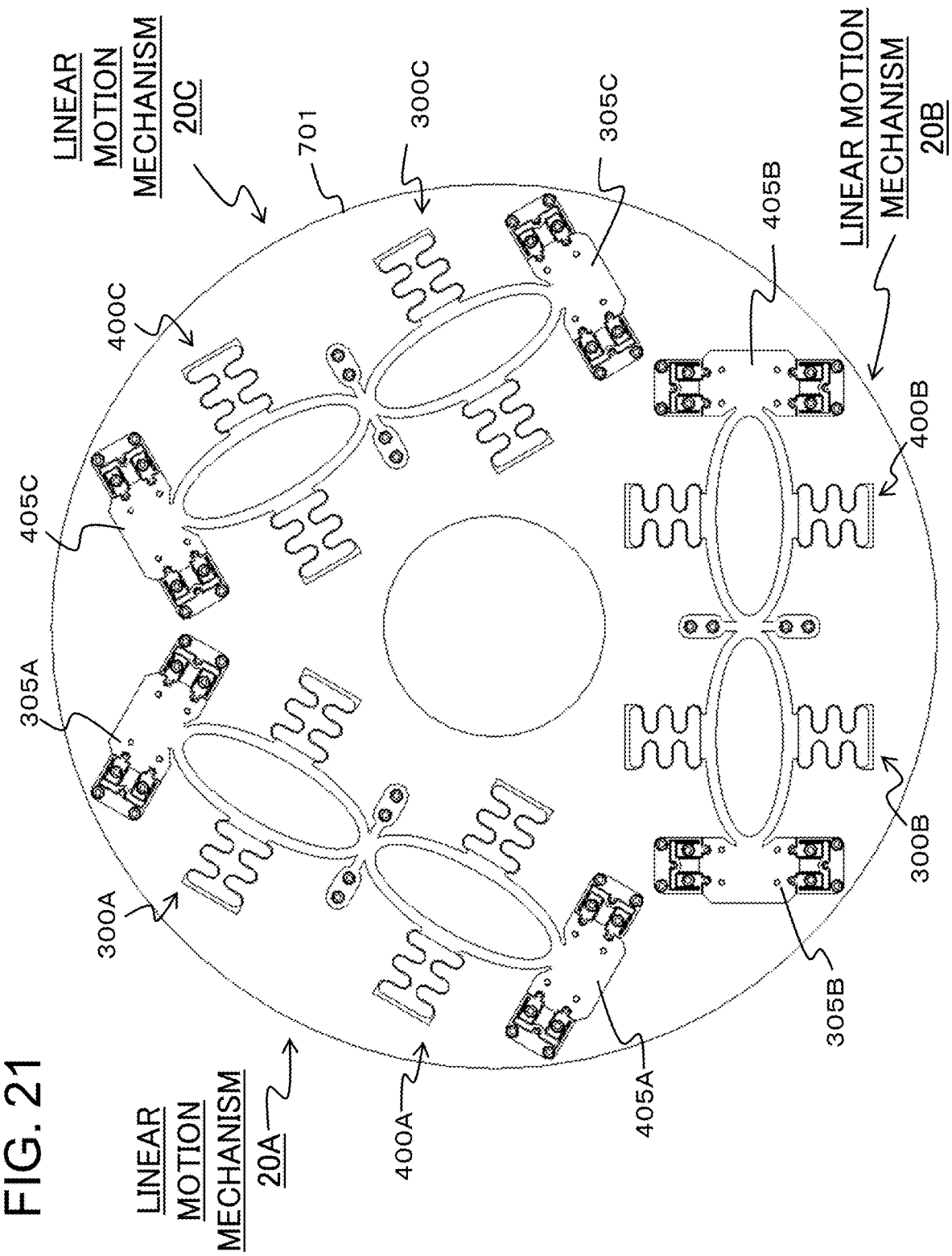
FIG. 21 is a plan view illustrating the second application as shown in FIG. 17 in a state such that both a mounting base and all bipods have been removed.

As shown in FIGS. 16C and 16D, when the operating plates 307a and 307b press/stretch the elliptical rings 301 and the operating plates 407a and 407b stretch/press the elliptical rings 401 so that the linear motion mechanism 20 moves the movable sections 305 and 405 in the same direction by the same displacement, the bipod 600 is moved as it is in the same direction by the same displacement as indicated by displacement 604 parallel to the main surface of the linear motion mechanism 20.

3.1.4) Production

The bipod 600 as structured above is made of elastic material with sufficient strength and may be formed integrally by using any technology such as injection molding, 3-dimentional printer or MEMS (Micro Electro Mechanical Systems).

3.2) Hexapod Arrangement 3.2.1) Structure

Referring to FIGS. 17-21, a hexapod arrangement having six degrees of freedom includes a base plate 701, a top plate 702 and three support assemblies A, B and C, each of which is composed of the bipod (600A, 600B, 600C) and the linear motion mechanism (20A, 20B, 20C) as shown in FIG. 8. The support assemblies A, B and C are fixed and arranged on the base plate 701 with regular-triangular configuration as typically shown in FIG. 20. The top plate 702 is fixed to the support sections of the bipods 600A, 600B and 600C. Accordingly, the top plate 702 is supported by three position-adjustable points.

As an example, the base plate 701 is circular and the top plate 702 is star-shaped. The top plate 702 may be formed of three legs 702A, 702B and 702C joined at a center point with the angle between any two adjacent legs being 120 degrees. The three legs 702A, 702B and 702C are supported respectively by the support assemblies A, B and C, as typically shown in FIG. 18. Needless to say, the top plate 702 may be circular. Further, the top plate 702 may be a mounted object requiring fine adjustment, such as optics (e.g. a mirror, prism or lens).

As described already, the linear motion mechanism 20A includes the first and second linear motion sections 300A and 400A which are capable of moving the movable sections 305A and 405A, respectively. Accordingly, as shown in FIGS. 16A-16D, the support section 603A of the bipod 600A fixed on the linear motion mechanism 20A can be moved to an arbitrary position within a limited range on a plane formed by the support rods 601A and 602A of the bipod 600A depending on the respective directions and displacements of linear motion of the movable sections 305A and 405A. It is the same with the linear motion mechanisms 20B and 20C.

3.2.2) Operation

Since the top plate 702 is supported by the support assemblies A, B and C, the position and/or inclination of the top plate 702 can be changed by independently controlling extension, retraction or parallel translation of linear motion of at least one of the linear motion mechanisms 20A, 20B and 20C. Hereinafter, typical operations of the hexapod arrangement will be described by referring to FIGS. 16A-16D and FIG. 18 as an example.

As shown in FIG. 16A, when the operating plates 307a and 307b and the operating plates 407a and 407b press the elliptical rings 301 and 401 respectively so that the linear motion mechanism 20 moves the movable sections 305 and 405 in the broadening directions, the height of a bipod 600 is reduced. As shown in FIG. 16B, when the operating plates 307a and 307b and the operating plates 407a and 407b stretch the elliptical rings 301 and 401 respectively so that the linear motion mechanism 20 moves the movable sections 305 and 405 in the reducing directions, the height of the bipod 600 is increased. As shown in FIGS. 16C and 16D, when the operating plates 307a and 307b press/stretch the elliptical rings 301 and the operating plates 407a and 407b stretch/press the elliptical rings 401 so that the linear motion mechanism 20 moves the movable sections 305 and 405 in the same direction by the same displacement, the bipod 600 performs parallel displacement. Accordingly, the top plate 702 can be freely moved in six directions by a combination of directions and displacements of motions provided by the respective linear motion mechanisms 20A, 20B and 20C.

It is assumed that the linear motion mechanisms 20B and 20C are not activated and only the linear motion mechanism 20A moves the movable sections 305A and 405A by the same displacement in the mutually opposite directions broadening the distance between the movable sections 305A and 405A. In this case, the height of the bipod 600A with respect to the main surface of the linear motion mechanism 20A is lowered, causing the top plate 702 to be inclined toward the leg 702A. Contrarily, when only the linear motion mechanism 20A moves the movable sections 305A and 405A by the same displacement in the mutually opposite directions reducing the distance between the movable sections 305A and 405A, the height of the bipod 600A with respect to the main surface of the linear motion mechanism 20A is increased, causing the top plate 702 to be inclined toward a center line between the legs 702B and 702C.

It is assumed that only the linear motion mechanism 20C is not activated and the linear motion mechanisms 20A and 20B are activated to move the corresponding movable sections by the same displacement in the mutually opposite directions broadening the distance between the corresponding movable sections. In this case, both of the heights of the bipods 600A and 600B are lowered, causing the top plate 702 to be inclined toward a center line between the legs 702A and 702B. Contrarily, when the linear motion mechanisms 20A and 20B are activated to move the corresponding movable sections by the same displacement in the mutually opposite directions reducing the distance between the corresponding movable sections, both of the heights of the bipods 600A and 600B become higher, causing the top plate 702 to be inclined toward the leg 702C.

It is assumed that only the linear motion mechanism 20C is not activated and the linear motion mechanisms 20A and 20B are activated to move the corresponding movable sections by the same displacement in the same direction. In this case, the top plate 702 is moved and inclined toward a center line between the legs 702A and 702B.

It is assumed that all the linear motion mechanisms 20A, 20B and 20C are activated to move the corresponding movable sections by the same displacement in the same direction, the bipods 600a, 600B and 600C are rotated, causing the top plate 702 to be rotated in the same direction by the same displacement.

The hexapod arrangement can perform fine adjustment of the top plate 702 other than the above-mentioned operations by independently controlling the linear motion mechanisms 20A, 20B and 20C.

3.2.3) Advantageous Effects

As described already, according to the linear motion mechanism according to the first or second exemplary embodiment, larger input displacement of the soft spring sections is transformed to smaller linear motion of the movable section according to a spring constant ratio. Accordingly, even whether the input displacement is applied to the soft spring sections with less precision, the hexapod system employing the linear motion mechanisms can move the top plate with greater precision. If the spring constant ratio is previously known, the amount of displacement of the top plate can be calculated with precision by precisely measuring the input displacement without precisely measuring the displacement of the top plate.

3.3) Micro-manipulator

Using MEMS technology, the linear motion mechanism according to the first or second exemplary embodiment can be easily miniaturized. Such a miniaturized linear motion mechanism can be preferably used as a movement reduction mechanism for a micromanipulator for manipulating cell-size objects under a microscope.

As illustrated in FIG. 22, a micromanipulator employs a pair of miniaturized linear motion mechanisms 10A and 10B according to the first exemplary embodiment. The movable sections 105 of the linear motion mechanisms 10A and 10B are provided with microtools 801 and 802, respectively, which are used to hold, cut or manipulate a cell-sized sample under a microscope.

The soft springs 104a and 104b of the linear motion mechanisms 10A and 10B are driven by drivers, respectively. A manipulator controller controls the microscope and drivers according to user's instructions through a monitor and an operation panel.

According to the linear motion mechanism according to the first or second exemplary embodiment, larger driven input displacement of the soft springs is transformed to smaller linear motion of the movable section according to a spring constant ratio. Accordingly, even whether the driven input displacement is applied to the soft spring sections with less precision, the micromanipulator employing the linear motion mechanisms can move the microtools with greater precision.

4. Other Applications

The present invention can be applied to high-precision measurement apparatus such as six-degree-of-freedom adjustment device which can be subject to various severe environments, such as aircrafts, spaceships and the like.

The present invention may be embodied in other specific forms without departing from the spirit or essential characteristics thereof. The above-described exemplary embodiment and examples are therefore to be considered in all respects as illustrative and not restrictive, the scope of the invention being indicated by the appended claims rather than by the foregoing description, and all changes which come within the meaning and range of equivalency of the claims are therefore intended to be embraced therein.

The invention claimed is:

1. A linear motion mechanism comprising:
   an elastic elliptical ring, wherein one end of a major axis of the elastic elliptical ring is fixed and the other end of the major axis is movable, the elastic elliptical ring transforming a displacement in a direction of a minor axis of the elastic elliptical ring to an output displacement in a direction of the major axis;
   an operating member arranged to deform the elastic elliptical ring in the direction of the minor axis, the operating member comprising a pair of spring members sandwiching the elastic elliptical ring in the direction of the minor axis; and
   a movable member fixed to the elastic elliptical ring to move in the direction of the major axis by the output displacement, wherein
      when the pair of spring members are pressed or stretched in mutually opposite input directions by an input displacement, the elastic elliptical ring is deformed by the displacement in the direction of the minor axis,
      a ratio between the input displacement and the output displacement of the movable member is determined by a combination of a spring constant of the elastic elliptical ring and a different spring constant of the pair of spring members, and
      the different spring constant of the pair of spring members is smaller than the spring constant of the elastic elliptical ring.

2. The linear motion mechanism according to claim 1, wherein the linear motion mechanism has a two-dimensional structure formed integrally.

3. A method for producing the linear motion mechanism according to claim 1, comprising:
   preparing an elastic plate having a predetermined thickness; and
   cutting the linear motion mechanism from the elastic plate.

4. A linear motion mechanism comprising:
   an elastic elliptical ring, wherein one end of a major axis of the elastic elliptical ring is fixed and the other end of the major axis is movable, the elastic elliptical ring transforming a displacement in a direction of a minor axis of the elastic elliptical ring to a linear motion displacement in the direction of the major axis;
   an operating member arranged to deform the elastic elliptical ring in the direction of the minor axis, the operating member comprising a pair of spring members sandwiching the elastic elliptical ring in the direction of the minor axis;

a movable member fixed to the other end of the major axis; and an elastic support member arranged to elastically support the movable member to move along the major axis, wherein when the pair of spring members are pressed or stretched in mutually opposite input directions by an input displacement, the elastic elliptical ring is deformed by the displacement in the direction of the minor axis, a ratio between the input displacement and the linear motion displacement of the movable member is determined by a combination of a spring constant of the elastic elliptical ring and a different spring constant of the pair of spring members, and the different spring constant of the pair of spring members is smaller than the spring constant of the elastic elliptical ring.

5. The linear motion mechanism according to claim 4, wherein the elastic support member restricts motion of the movable member to linear motion along the direction of the major axis.

6. The linear motion mechanism according to claim 4, wherein the elastic support member comprises a pair of support sections sandwiching the movable member therebetween through a plurality of leaf springs.

7. The linear motion mechanism according to claim 4, wherein the linear motion mechanism has a two-dimensional structure formed integrally by cutting its plane structural shape from a single elastic plate having a predetermined thickness.

8. A method for producing the linear motion mechanism according to claim 4, comprising:

preparing an elastic plate having a predetermined thickness; and cutting the linear motion mechanism from the elastic plate.

9. An integrated linear motion mechanism comprising: a first linear motion section comprising a first linear motion mechanism according to claim 4; and a second linear motion section comprising a second linear motion mechanism according to claim 4; wherein the first linear motion section is fixed to the second linear motion section at a common fixed point.

* * * * *